(12) United States Patent
Chen et al.

(10) Patent No.: US 11,081,420 B2
(45) Date of Patent: Aug. 3, 2021

(54) SUBSTRATE STRUCTURE AND SEMICONDUCTOR PACKAGE STRUCTURE

(71) Applicant: Advanced Semiconductor Engineering, Inc., Kaohsiung (TW)

(72) Inventors: Hsin-En Chen, Kaohsiung (TW); Ian Hu, Kaohsiung (TW); Chih-Pin Hung, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 20 days.

(21) Appl. No.: 16/508,210

(22) Filed: Jul. 10, 2019

(65) Prior Publication Data

US 2021/0013118 A1 Jan. 14, 2021

(51) Int. Cl.
*H01L 23/34* (2006.01)
*H01L 23/367* (2006.01)
*H01L 23/427* (2006.01)

(52) U.S. Cl.
CPC .......... *H01L 23/367* (2013.01); *H01L 23/427* (2013.01)

(58) Field of Classification Search
CPC ............. H01L 25/0657; H01L 2224/97; H01L 23/4334; H01L 25/0655; H01L 21/4882; H01L 23/5389; H01L 24/97; H01L 23/5226; H01L 2023/4043; H01L 2023/405; H01L 23/345; H01L 23/4012; H01L 25/117; H01L 2023/4056
USPC ........................................................ 257/713
See application file for complete search history.

(56) References Cited

U.S. PATENT DOCUMENTS

2015/0162216 A1* 6/2015 Woychik ................. H01L 24/03
438/667

* cited by examiner

*Primary Examiner* — Theresa T Doan
(74) *Attorney, Agent, or Firm* — Foley & Lardner LLP

(57) ABSTRACT

A semiconductor package structure includes a package substrate, at least one semiconductor die, a heat dissipating device, at least one electronic device and a heat transmitting structure. The package substrate has a first surface and a second surface opposite to the first surface. The semiconductor die is electrically connected to the first surface of the package substrate. The heat dissipating device is thermally connected to the first surface of the package substrate. The electronic device is electrically connected to the second surface of the package substrate. The electronic device has a first surface and a second surface opposite to the first surface, and the first surface of the electronic device faces the second surface of the package substrate. The heat transmitting structure is disposed adjacent to the second surface of the package substrate, and thermally connected to the electronic device and the heat dissipating device.

20 Claims, 28 Drawing Sheets

SUBSTRATE STRUCTURE AND SEMICONDUCTOR PACKAGE STRUCTURE

BACKGROUND

1. Field of the Disclosure

The present disclosure relates to a substrate structure and a semiconductor package structure, and to a substrate structure including a heat transmitting structure, and a semiconductor package structure including the same.

2. Description of the Related Art

A specification of a semiconductor package structure may include a high-speed data transmission capability, a high data capacity and a small footprint. Heat dissipation is also an issue for such a semiconductor package structure. During operation, high-speed data transmission can result in a significant amount of heat being generated and can raise a temperature of the semiconductor package structure. Due to the small size of the semiconductor package structure, it can be difficult to dissipate the heat. If the heat is not dissipated efficiently, the performance of the semiconductor package structure can be decreased, or the semiconductor package structure may break down or be rendered inoperative.

SUMMARY

In some embodiments, a semiconductor package structure includes a package substrate, at least one semiconductor die, a heat dissipating device, at least one electronic device and a heat transmitting structure. The package substrate has a first surface and a second surface opposite to the first surface. The semiconductor die is electrically connected to the first surface of the package substrate. The heat dissipating device is thermally connected to the first surface of the package substrate. The electronic device is electrically connected to the second surface of the package substrate. The electronic device has a first surface and a second surface opposite to the first surface, and the first surface of the electronic device faces the second surface of the package substrate. The heat transmitting structure is disposed adjacent to the second surface of the package substrate, and thermally connected to the electronic device and the heat dissipating device.

In some embodiments, a substrate structure includes a package substrate and a heat transmitting structure. The package substrate has a first surface and a second surface opposite to the first surface, and includes a dielectric structure and at least one circuit layer embedded in the dielectric structure. The package substrate defines at least one groove on the second surface thereof, and the at least one groove is formed by machining. The heat transmitting structure is disposed in the at least one groove. The thickness of the heat transmitting structure is greater than five times a thickness of the circuit layer of the package substrate.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
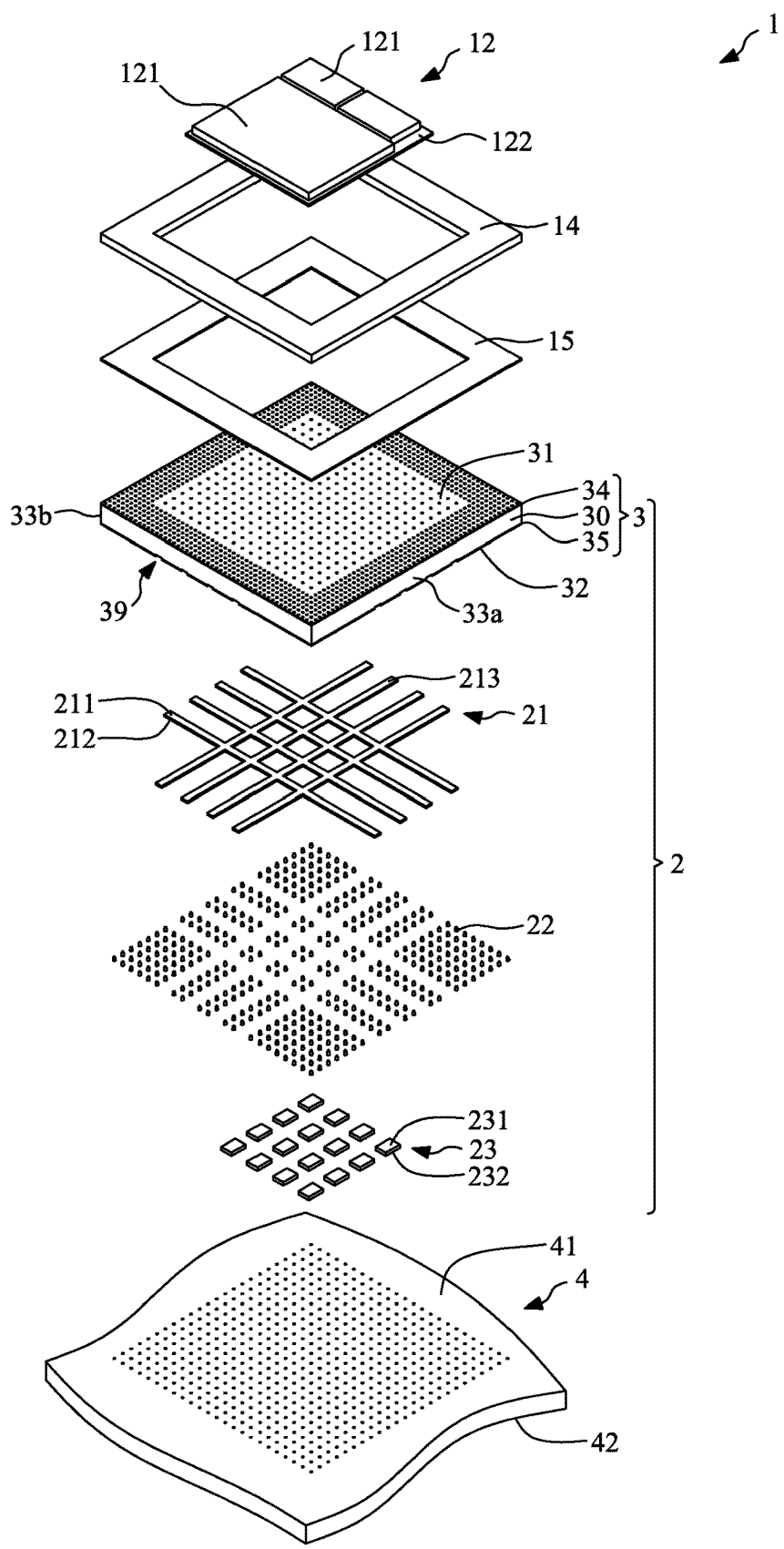
FIG. 1 illustrates an exploded perspective view of a semiconductor package structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

To meet the specification of increasing functions, a number of devices integrated in a semiconductor package structure should increase. Thus, the power density and a number of heat sources are increased, and the thermal resistance is relatively large. In addition, it is difficult to dissipate the heat generated by the device at the center of the semiconductor package structure. To address the above concerns, in some comparative embodiments, a fan is provided. The fan is attached to the semiconductor package structure to dissipate the heat at the periphery of the semiconductor package structure by air flow. However, such fan may not dissipate the heat generated by the device at the center of the semiconductor package structure. In some comparative embodiments, a number of substrate vias or a thickness of metal layer are increased. However, the improvement of heat dissipation efficiency is slight. In some comparative embodiments, a thermal interface material (TIM) is used to be interposed between the devices and the package substrate. However, the temperature of the device at the center of the semiconductor package structure may not be significantly reduced.

At least some embodiments of the present disclosure provide for a substrate structure which has a high improvement of heat dissipation efficiency. In some embodiments, a semiconductor package structure including such substrate structure includes a heat transmitting structure disposed adjacent to a surface of the substrate structure and thermally connected to the device. At least some embodiments of the present disclosure further provide for techniques for manufacturing the substrate structure.

Figure 2:
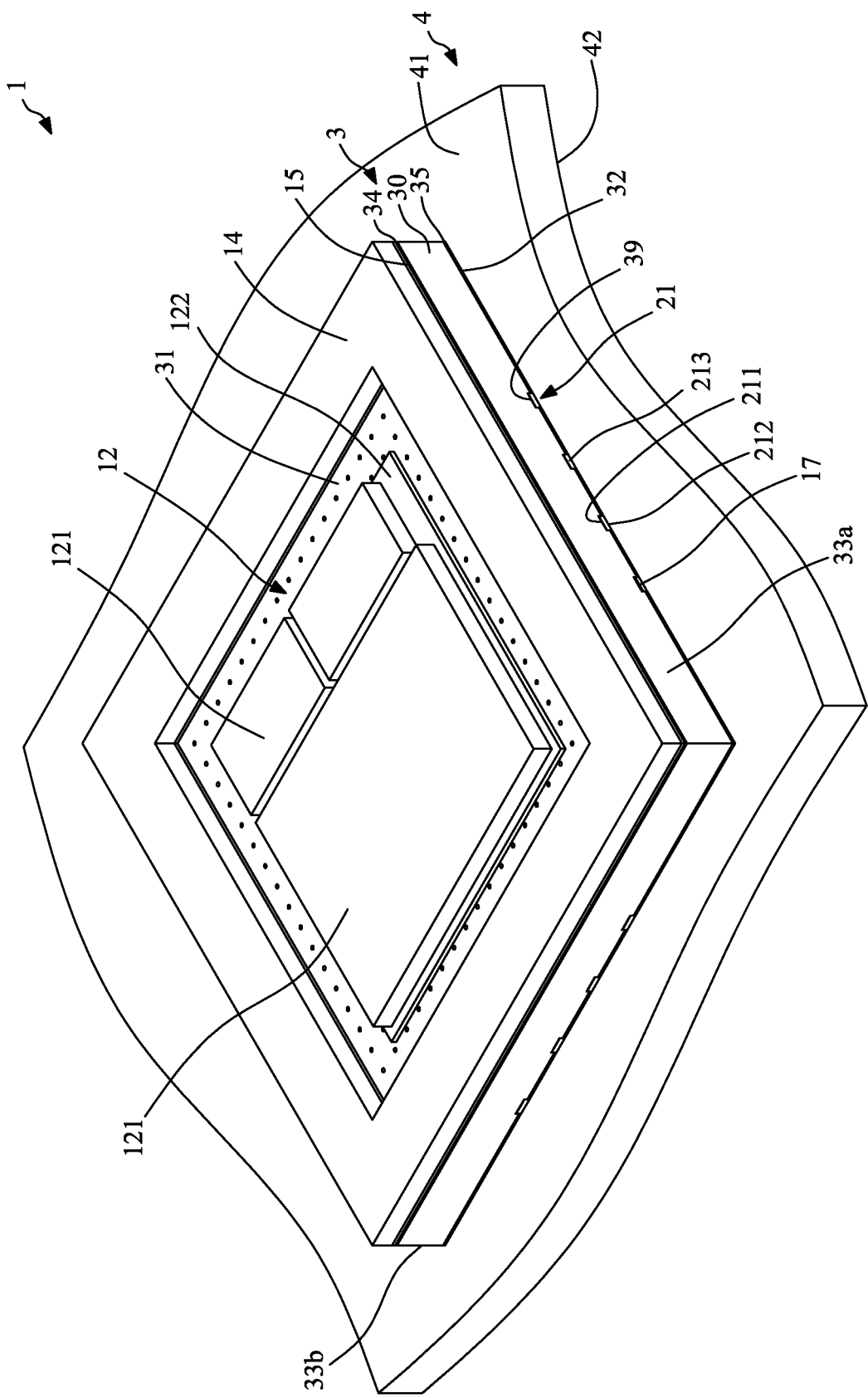
FIG. 2 illustrates an assembled perspective view of the semiconductor package structure of FIG. 1.
Figure 3:
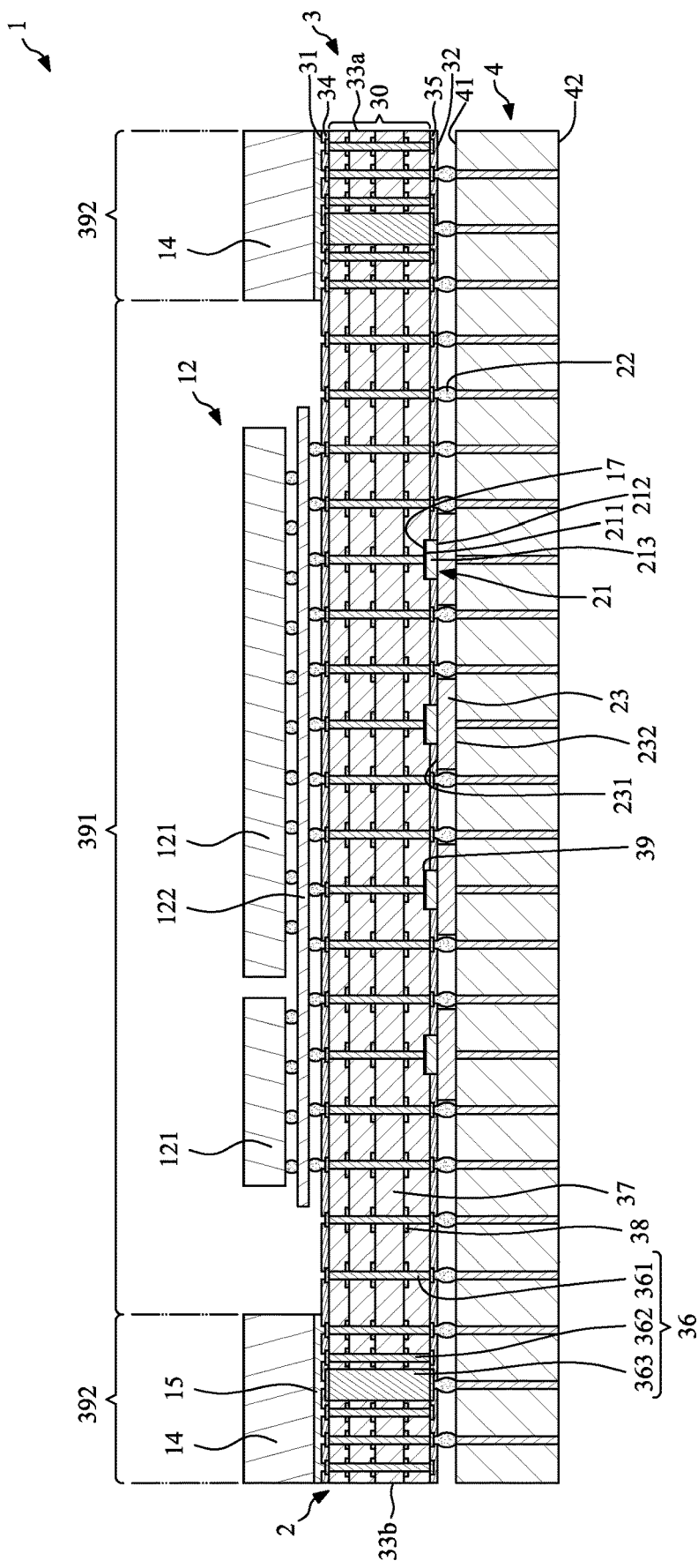
FIG. 3 illustrates a cross-sectional view of the semiconductor package structure of FIG. 2.
Figure 4:
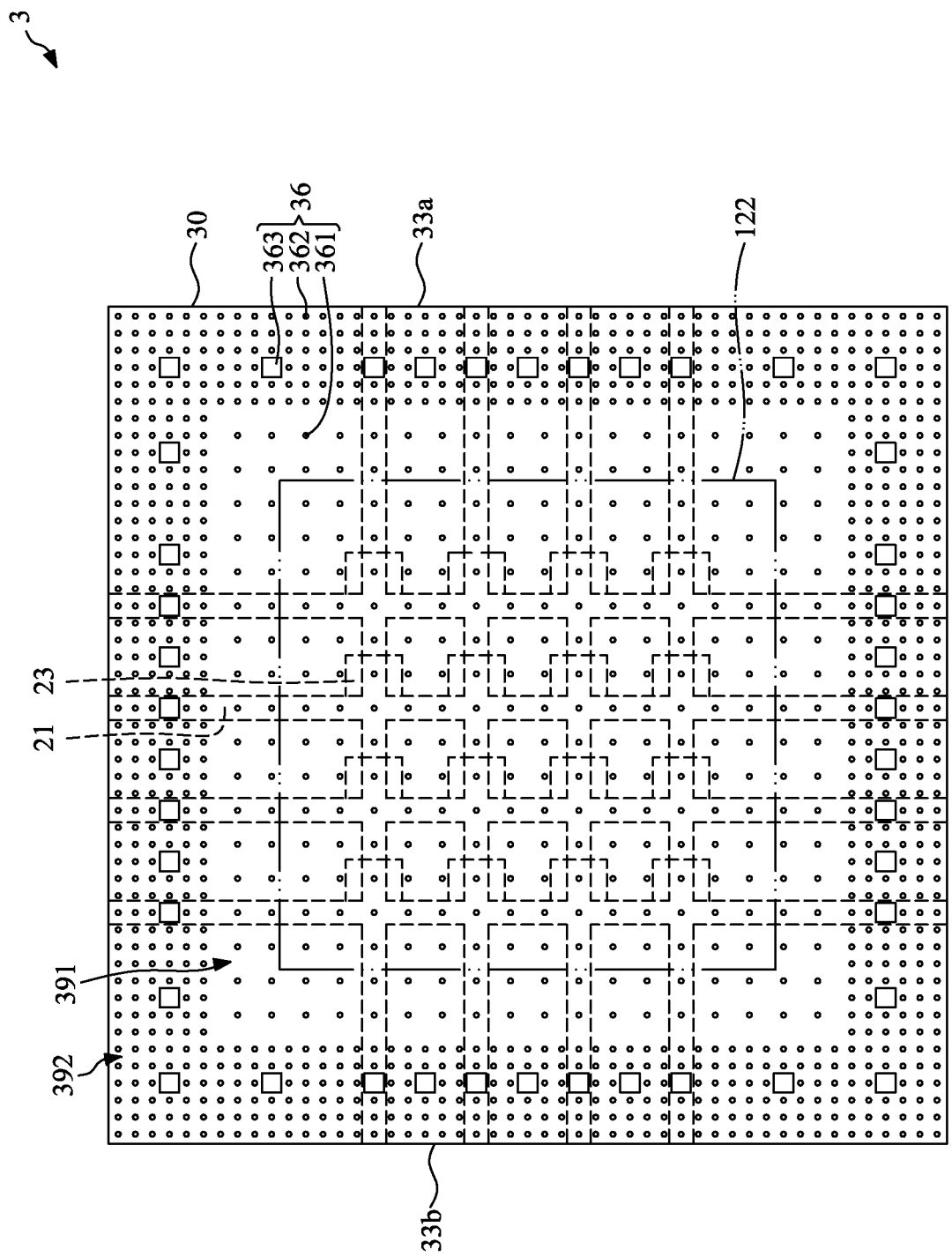
FIG. 4 illustrates a top view of a package substrate, wherein a topmost circuit layer and a first protection layer are omitted.

FIG. 1 illustrates an exploded perspective view of a semiconductor package structure 1 according to some embodiments of the present disclosure. FIG. 2 illustrates an assembled perspective view of the semiconductor package structure 1 of FIG. 1. FIG. 3 illustrates a cross-sectional view of the semiconductor package structure 1 of FIG. 2. FIG. 4 illustrates a top view of a package substrate 3, wherein a topmost circuit layer and a first protection layer are omitted.

The semiconductor package structure 1 includes a substrate structure 2 (including, for example, a package substrate 3, a heat transmitting structure 21, a plurality of solder bumps 22 and at least one electronic device 23), an upper semiconductor device 12 (including, for example, at least one semiconductor die 121), a heat dissipating device 14, a thermal adhesive tape 15 and a bottom device 4.

The package substrate 3 has a first surface 31 (e.g., a top surface), a second surface 32 (e.g., a bottom surface) opposite to the first surface 31, a right lateral peripheral surface 33a and a left lateral peripheral surface 33b. The right lateral peripheral surface 33a and the left lateral peripheral surface 33b extend between the first surface 31 and the second surface 32. The package substrate 3 may include a substrate body 30, a first protection layer 34, a second protection layer 35 and a plurality of vias 36. The substrate body 30 may include a plurality of passivation layers 37 and at least one circuit layer 38 (e.g., redistribution layer, RDL) interposed between the passivation layers 37. The material of the passivation layers 37 may be organic or inorganic. For example, a material of the passivation layers 37 may include a glass-reinforced epoxy resin material (e.g., FR4 grade glass-reinforced epoxy resin), bismaleimide triazine (BT), epoxy, silicon, PCB material, glass, ceramic, or a combination of two or more thereof. The circuit layer 38 may be embedded in the package substrate 3 (or the substrate body 30). In addition, a plurality of passive components may be embedded in the package substrate 3 and electrically connected to the circuit layer 38. A thickness of the circuit layer 38 may be 15 μm to 30 μm.

The first protection layer 34 is disposed on the top surface of the substrate body 30, and the second protection layer 35 is disposed on the bottom surface of the substrate body 30. The vias 36 (including, for example, a plurality of inner vias 361, a plurality of outer vias 362 and a plurality of thermal vias 363) may extend through the substrate body 30, and electrically connect the topmost circuit layer of the substrate body 30 and the bottommost circuit layer of the substrate body 30. Portions of the topmost circuit layer of the substrate body 30 may be exposed from openings defined by the first protection layer 34, and portions of the bottommost circuit layer of the substrate body 30 may be exposed from openings defined by the second protection layer 35. In some embodiments, two ends of the vias 36 (including, for example, the inner vias 361, the outer vias 362 and the thermal vias 363) may be exposed from openings defined by the first protection layer 34 and the second protection layer 35 respectively. Thus, the vias 36 (including, for example, the inner vias 361, the outer vias 362 and the thermal vias 363) may substantially extend through the package substrate 3 (or the substrate body 30).

As shown in FIG. 4, the package substrate 3 (or the substrate body 30) has an inner area 391 and an outer area 392 surrounding the inner area 391. The inner vias 361 are disposed in the inner area 391. The outer vias 362 and the thermal vias 363 are disposed in the outer area 392. In some embodiments, a width of the inner via 361 may be equal to a width of the outer via 362, and a pitch between the inner vias 361 is greater than a pitch between the outer vias 362. For example, the pitch between the inner vias 361 may be 2 mm, and the pitch between the outer vias 362 may be 0.5 mm. A width of the thermal via 363 may be greater than the width of the outer via 362. For example, the width of the thermal via 363 may be three, four or five times the width of the outer via 362.

As shown in FIG. 1, the upper semiconductor device 12 may include an interposer 122 and at least one semiconductor die 121 (e.g., three semiconductor dice 121) disposed on and electrically connected to the interposer 122. As shown in FIG. 2 and FIG. 3, the upper semiconductor device 12 is disposed on and electrically connected to the first surface 31 of the package substrate 3. Thus, the semiconductor die 121 is electrically connected to the first surface 31 of the package substrate 3.

As shown in FIG. 1, FIG. 2 and FIG. 3, the heat dissipating device 14 is thermally connected to the first surface 31 of the package substrate 3 through the thermal adhesive tape 15. The heat dissipating device 14 may be a ring structure surrounding the upper semiconductor device 12 (including the semiconductor die 121). In some embodiments, the heat dissipating device 14 may be a solid monolithic structure that is made from metal such as copper or aluminum. A size and position of the heat dissipating device 14 may correspond to the outer area 392 of the package substrate 3 (or the substrate body 30). Thus, the heat dissipating device 14 may be thermally connected to the thermal vias 363 and the outer vias 362.

The heat transmitting structure 21 is disposed adjacent to the second surface 32 of the package substrate 3. As shown in FIG. 3, the heat transmitting structure 21 is attached to the package substrate 3 through a soldering material 17, and is thermally connected to the vias 36 (including, for example, the inner vias 361, the outer vias 362 and the thermal vias 363). The heat transmitting structure 21 may include a plurality of strip structures, and the strip structure includes a plurality of metal strips 213 or a plurality of heat pipes 214*b* (FIG. 9) or a combination thereof. As shown in FIG. 1, the metal strips 213 may be solid strips cross with one another to form a grid shape, and may be formed integrally as a monolithic structure. A material of the metal strips 213 may be copper or aluminum. A thickness of each of the metal strips 213 may be 0.2 mm. The heat transmitting structure 21 has a first surface 211 (e.g., a top surface) and a second surface 212 (e.g., a bottom surface) opposite to the first surface 211. As shown in FIG. 3, the outer vias 362 and the thermal vias 363 may thermally connect the heat transmitting structure 21 and the heat dissipating device 14. It is noted that the heat transmitting structure 21 is not a circuit layer 38 of the package substrate 3 (or the substrate body 30). A thickness of the heat transmitting structure 21 may be greater than three or five times a thickness of the circuit layer 38 of the package substrate 3.

The solder bumps 22 (e.g., solder balls) are disposed adjacent to the second surface 32 of the package substrate 3, and may be electrically isolated from the heat transmitting structure 21. The solder bumps 22 may be disposed in the openings of the second protection layer 35 to connect the bottommost circuit layer of the substrate body 30. In some embodiments, the solder bumps 22 may not be disposed on the heat transmitting structure 21. That is, all of the solder bumps 22 may not contact nor electrically connect the heat transmitting structure 21.

As shown in FIG. 1, the substrate structure 2 includes a plurality of electronic devices 23 (e.g., power management integrated circuits, PMICs) that are electrically connected to the second surface 32 of the package substrate 3. The electronic devices 23 may be arranged in an array, and each of the electronic devices 23 may be disposed near a respective one of the intersection points of the metal strips 213 of the heat transmitting structure 21. The electronic device 23 has a first surface 231 and a second surface 232 opposite to the first surface 231. The first surface 231 of the electronic device 23 faces the second surface 32 of the package substrate 3. In some embodiments, the electronic device 23 is bonded to and electrically connected to the bottommost circuit layer of the substrate body 30. The electronic device 23 may be a leadframe-type semiconductor package. However, in another embodiment, the electronic device 23 may be a ball grid array (BGA) type semiconductor package.

Figure 13:
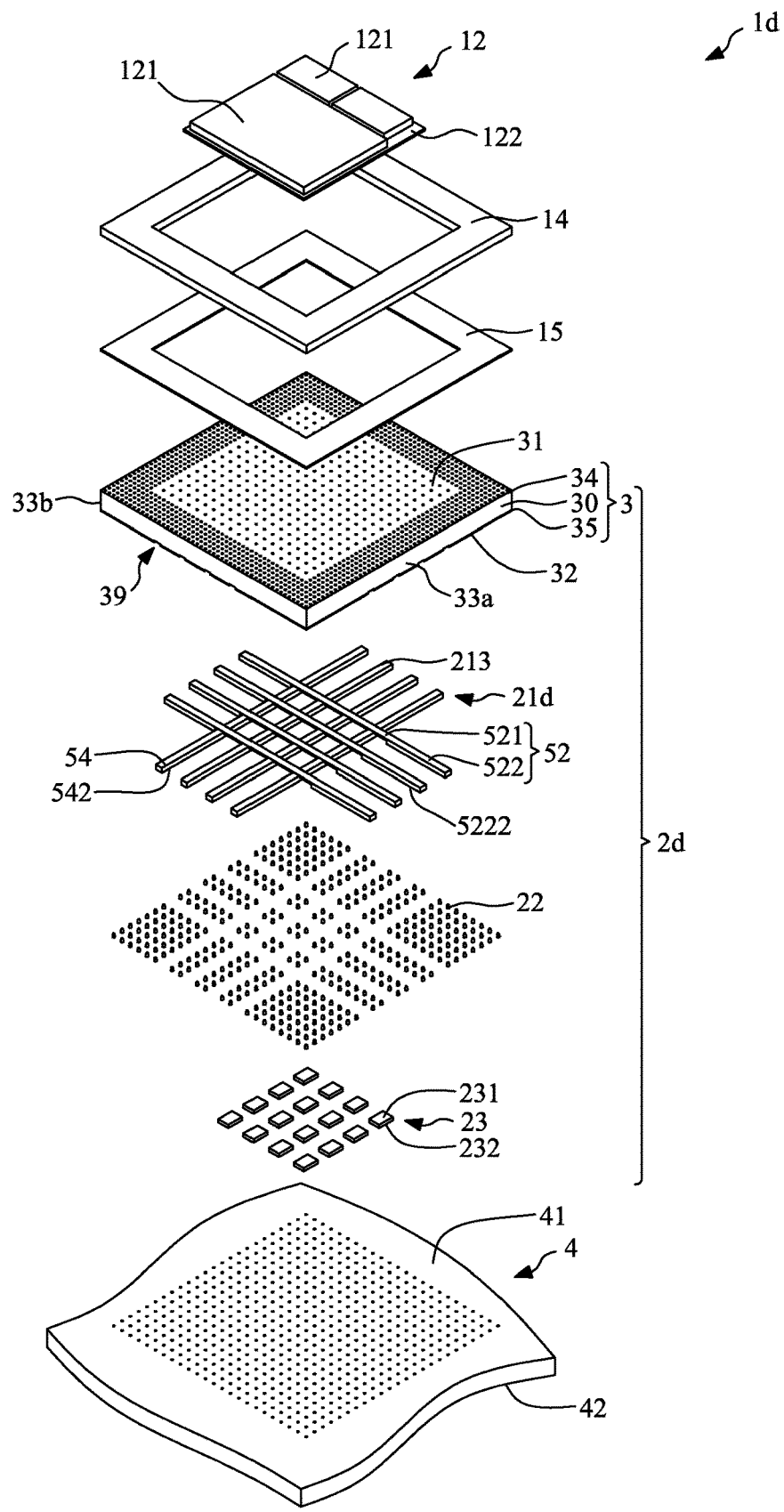
FIG. 13 illustrates an exploded perspective view of a semiconductor package structure according to some embodiments of the present disclosure.

The bottom device 4 may be a printed circuit board (PCB) or a semiconductor package. The bottom device 4 may have a first surface 41 and a second surface 42 opposite to the first surface 41. The substrate structure 2 (or the package substrate 3) is bonded to the bottom device 4 through the solder bumps 22. The second surface 32 of the package substrate 3 faces the first surface 41 of the bottom device 4. A gap between the second surface 32 of the package substrate 3 and the first surface 41 of the bottom device 4 may be 0.57 mm. In some embodiment, the heat transmitting structure 21 may contact the first surface 41 of the bottom device 4 (as shown in FIG. 13).

Figure 5:
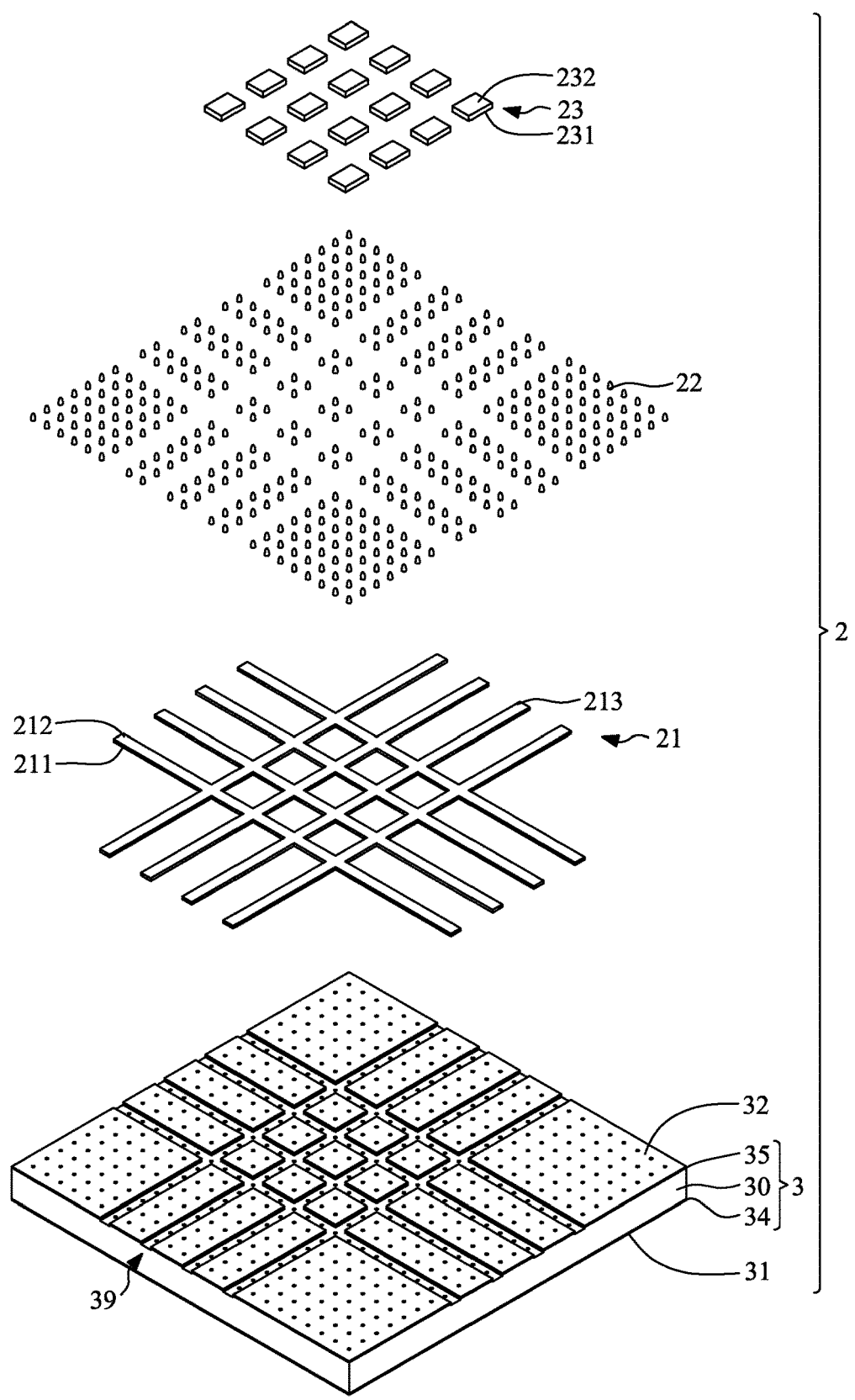
FIG. 5 illustrates an enlarged bottom perspective view of the package substrate, the heat transmitting structure, the solder bumps and the electronic device of FIG. 1.
Figure 6:
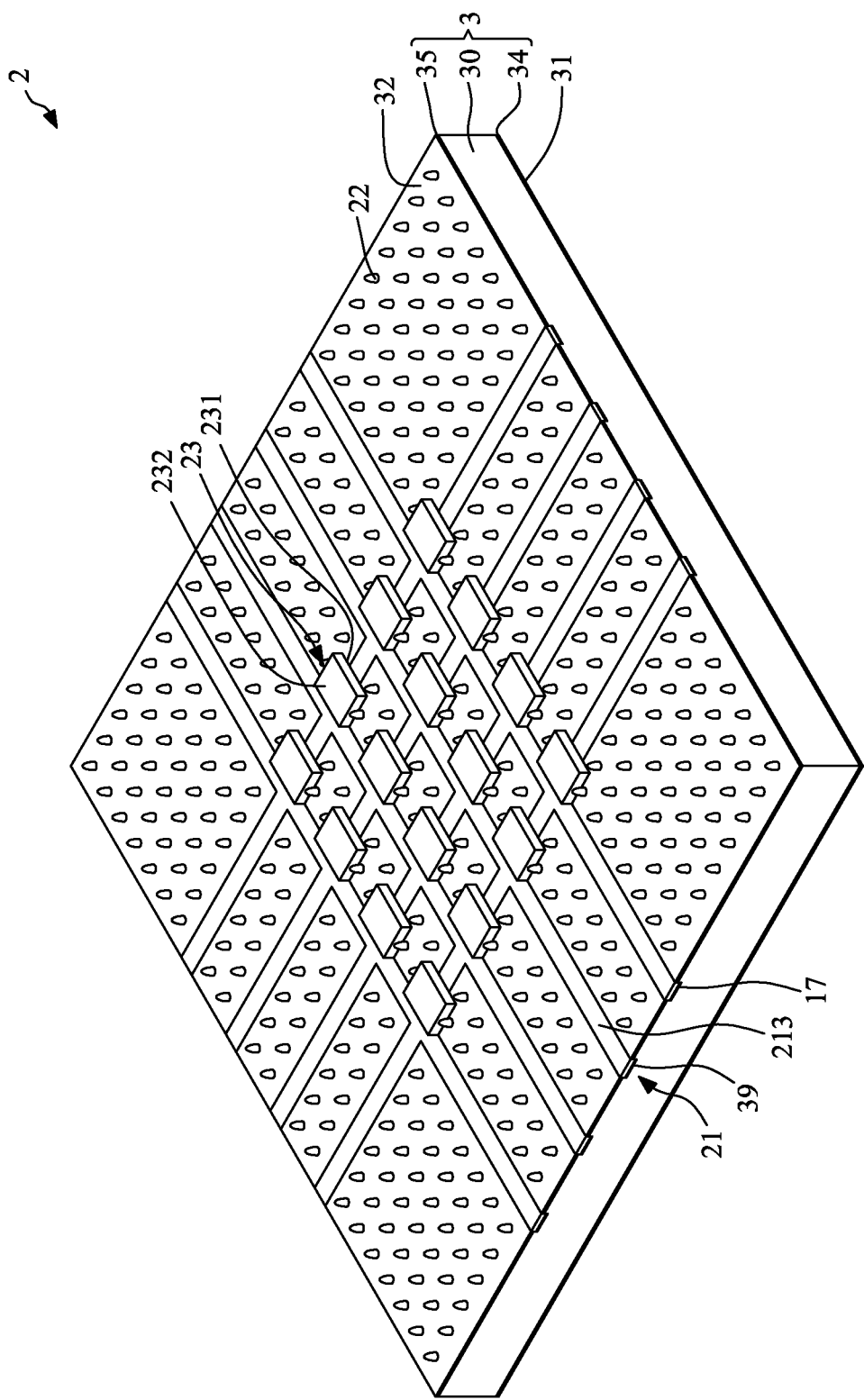
FIG. 6 illustrates an assembly view of FIG. 5.

FIG. 5 illustrates an enlarged bottom perspective view of the package substrate 3, the heat transmitting structure 21, the solder bumps 22 and the electronic device 23 of FIG. 1. FIG. 6 illustrates an assembly view of FIG. 5. The package substrate 3 defines at least one groove 39 on the second surface 32 of the package substrate 3 for accommodating the heat transmitting structure 21. The groove 39 may not extend through the package substrate 3, and may be recessed from the second surface 32 of the package substrate 3. Thus, the vias 36 (including, for example, the inner vias 361, the outer vias 362 and the thermal vias 363) may be exposed in the groove 39. In some embodiments, the groove 39 may extend to the lateral peripheral surface of the package substrate 3, such as extend between the right lateral peripheral surface 33*a* and the left lateral peripheral surface 33*b* (FIG. 3 and FIG. 4). The groove 39 may be formed by machining such as milling. A size and shape of the groove 39 may be substantially equal to a size and shape of the heat transmitting structure 21. Thus, as shown in FIG. 6, the heat transmitting structure 21 extend to the lateral peripheral surface of the package substrate 3, such as between the right lateral peripheral surface 33*a* and the left lateral peripheral surface 33*b* (FIG. 3 and FIG. 4).

As shown in FIG. 6, the first surface 211 of the heat transmitting structure 21 is far away from the second surface 32 of the package substrate 3 (e.g., the second surface 212 of the heat transmitting structure 21 is near the second surface 32 of the package substrate 3). The second surface 212 of the heat transmitting structure 21 is substantially coplanar with the second surface 32 of the package substrate 3. That is, the second surface 212 of the heat transmitting structure 21 is exposed from the second surface 32 of the package substrate 3, and a height difference (or a gap) between the second surface 212 of the heat transmitting structure 21 and the second surface 32 of the package substrate 3 is less than about 5 µm. In addition, the electronic device 23 is disposed adjacent to the second surface 32 of the package substrate 3 and across a portion of the metal strip 213 of the heat transmitting structure 21. The electronic device 23 covers the metal strip 213 of the heat transmitting structure 21. The first surface 231 of the electronic device 23 is connected to the second surface 212 of the heat transmitting structure 21 through a solder material. Thus, the heat transmitting structure 21 is thermally connected to the electronic device 23 and the heat dissipating device 14 (FIG.

3 and FIG. 6). Alternatively, the first surface 231 of the electronic device 23 may contact the second surface 212 of the heat transmitting structure 21 directly.

As shown in the embodiment illustrated in FIG. 3, the electronic device 23 is thermally connected to the heat dissipating device 14 through the heat transmitting structure 21, the outer vias 362 and the thermal vias 363. Thus, the heat generated by the electronic device 23 during operation may be transmitted to the heat dissipating device 14 quickly, and then dissipated to the air. As a result, the temperature of the semiconductor package structure 1 can be reduced. In addition, due to the design of the heat transmitting structure 21, the temperature distribution on the second surface 32 of the package substrate 3 can be more even. That is, the heat may not concentrate at the center of the second surface 32 of the package substrate 3.

Figure 7:
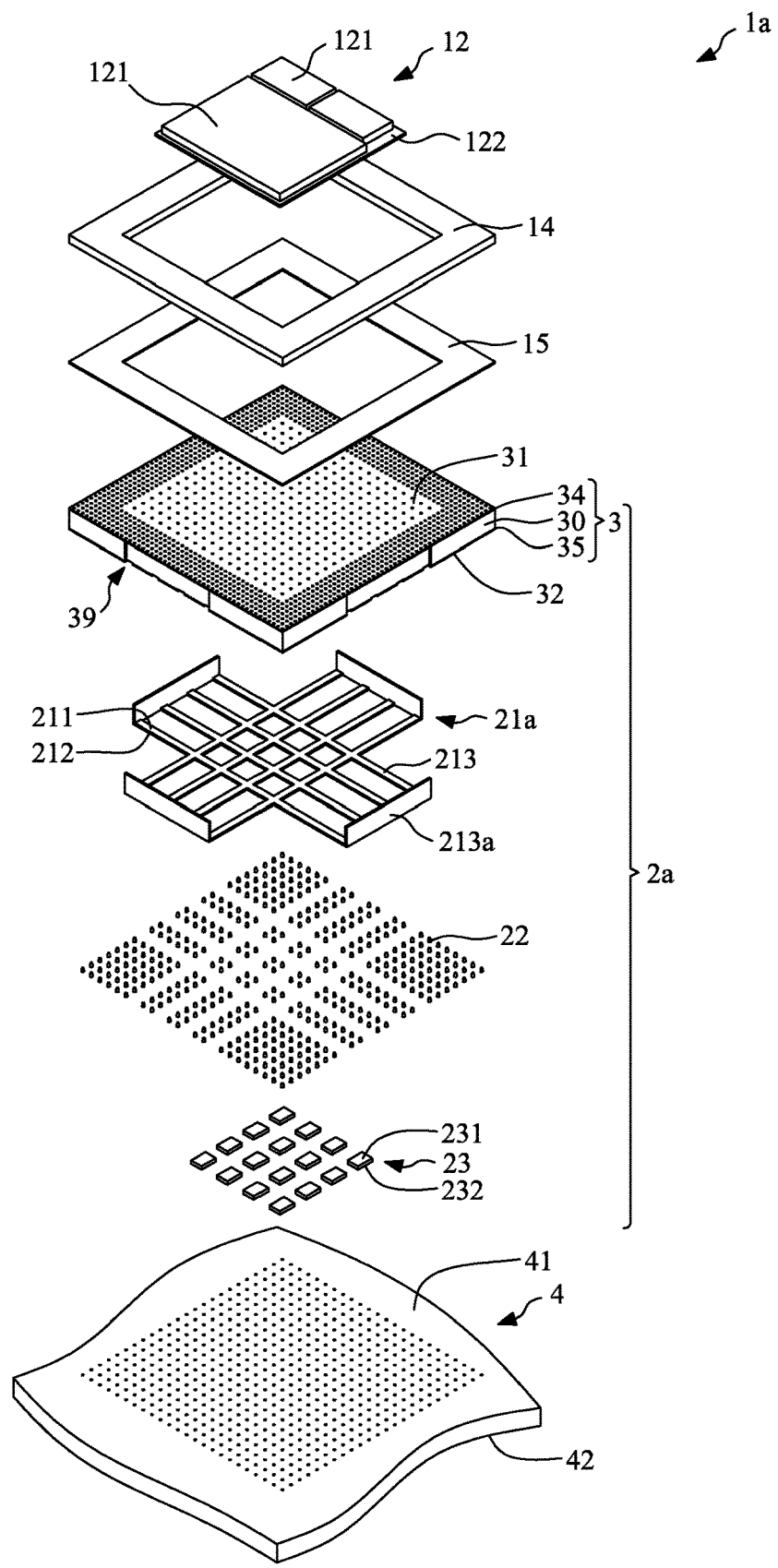
FIG. 7 illustrates an exploded perspective view of a semiconductor package structure according to some embodiments of the present disclosure.
Figure 8:
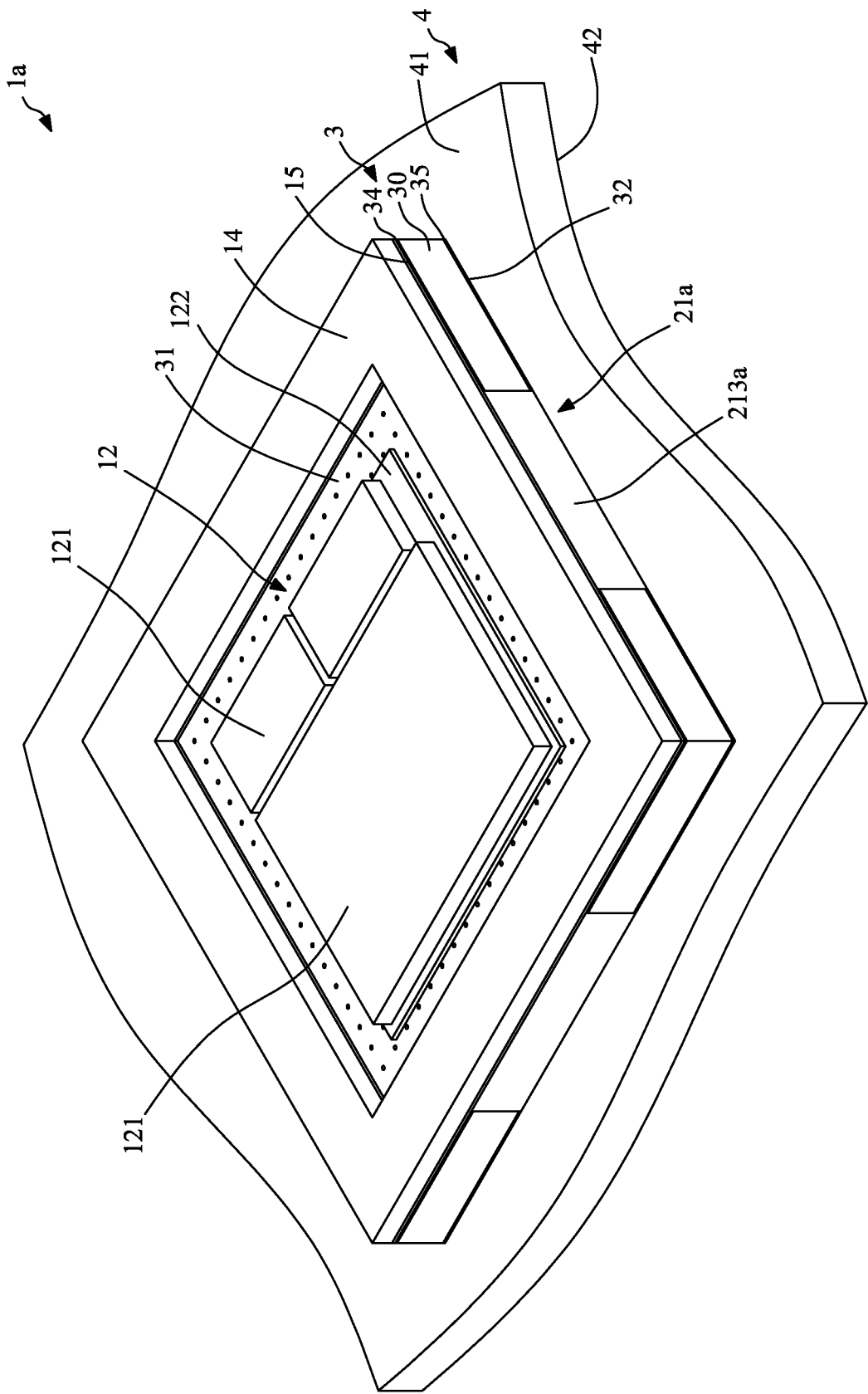
FIG. 8 illustrates an assembled perspective view of the semiconductor package structure of FIG. 7.

FIG. 7 illustrates an exploded perspective view of a semiconductor package structure 1a according to some embodiments of the present disclosure. FIG. 8 illustrates an assembled perspective view of the semiconductor package structure 1a of FIG. 7. The semiconductor package structure 1a is similar to the semiconductor package structure 1 shown in FIG. 1 through FIG. 6, except for a structure of the heat transmitting structure 21a of the substrate structure 2a. As shown in FIG. 7, the ends of the strip structure (including the metal strips 213) of the heat transmitting structure 21a adjacent to or exposed from a lateral peripheral surface (e.g., the right lateral peripheral surface 33a and the left lateral peripheral surface 33b) of the package substrate 3 may be connected to one another through a connection portion 213a. In some embodiments, the heat transmitting structure 21a may be formed integrally as a monolithic structure. As shown in FIG. 8, the connection portion 213a may be embedded in lateral peripheral surface (e.g., the right lateral peripheral surface 33a and the left lateral peripheral surface 33b) of the package substrate 3. Further, a top surface of the connection portion 213a may thermally connect or contact the bottom surface of the heat dissipating device 14.

Figure 9:
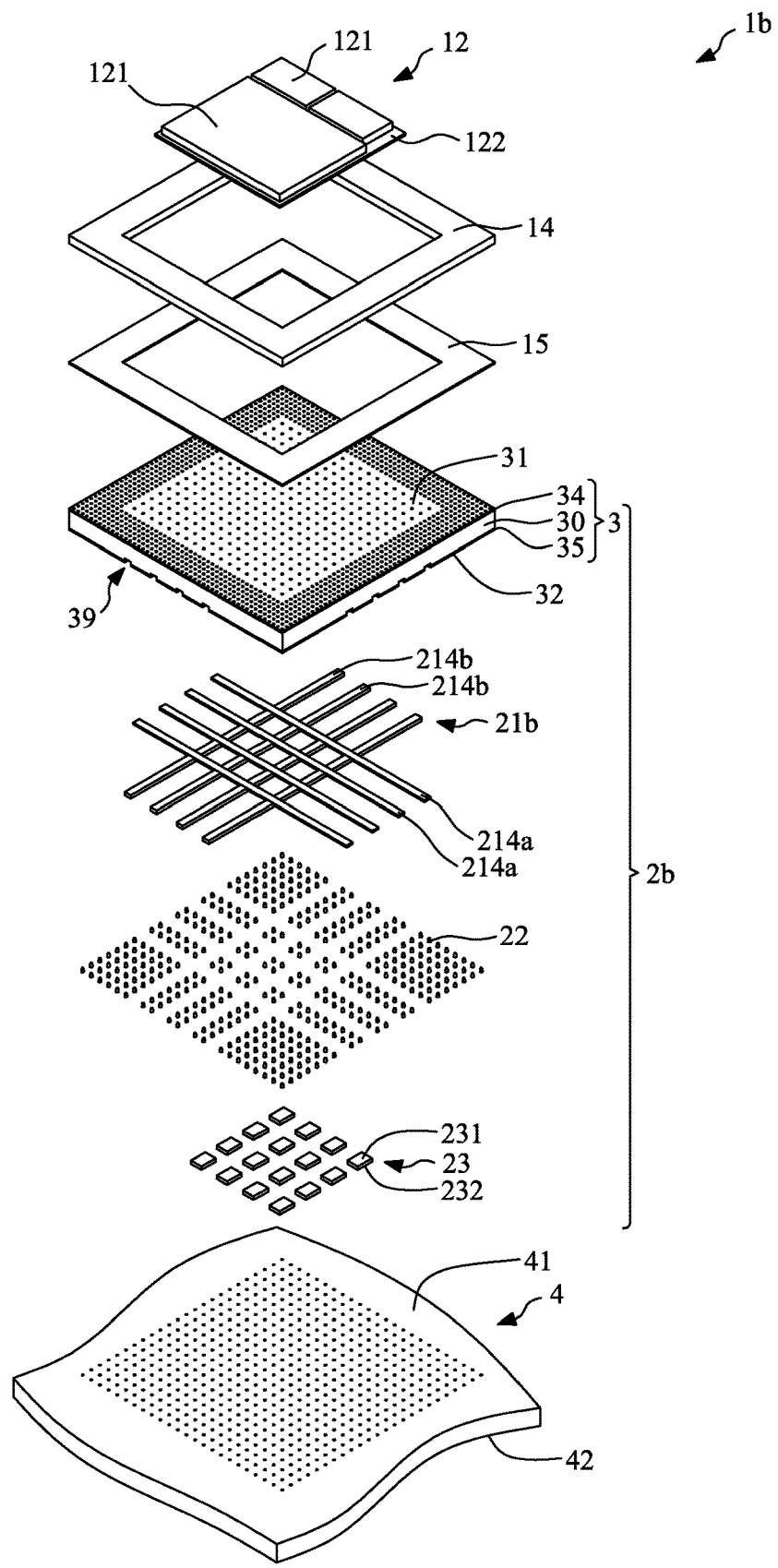
FIG. 9 illustrates an exploded perspective view of a semiconductor package structure according to some embodiments of the present disclosure.
Figure 10:
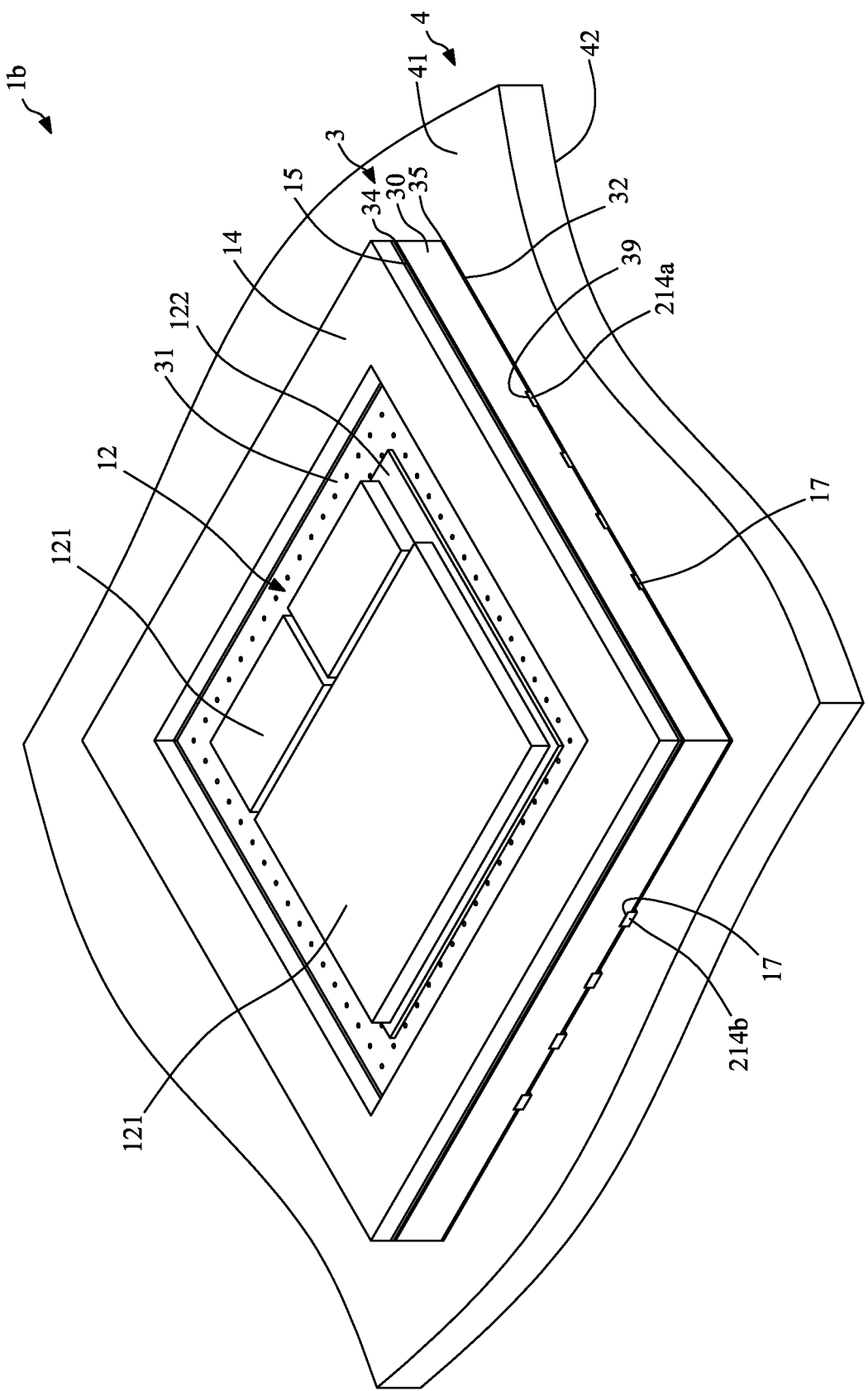
FIG. 10 illustrates an assembled perspective view of the semiconductor package structure of FIG. 9.

FIG. 9 illustrates an exploded perspective view of a semiconductor package structure 1b according to some embodiments of the present disclosure. FIG. 10 illustrates an assembled perspective view of the semiconductor package structure 1b of FIG. 9. The semiconductor package structure 1b is similar to the semiconductor package structure 1 shown in FIG. 1 through FIG. 6, except for a structure of the heat transmitting structure 21b of the substrate structure 2b. As shown in FIG. 9, the heat transmitting structure 21b includes a plurality of metal strips 214a and a plurality of heat pipes 214b. The metal strips 214a are substantially parallel with one another. The heat pipes 214b are substantially parallel with one another and perpendicular to and cross with the metal strips 214a to form a plurality intersection portions. Thus, the metal strips 214a are thermally connected to the heat pipes 214b. Portions of the metal strips 214a at the intersection portions may be embedded in the heat pipes 214b. A thickness of the metal strip 214a may be 0.2 mm, and a thickness of the heat pipe 214b may be 0.4 mm.

Figure 11:
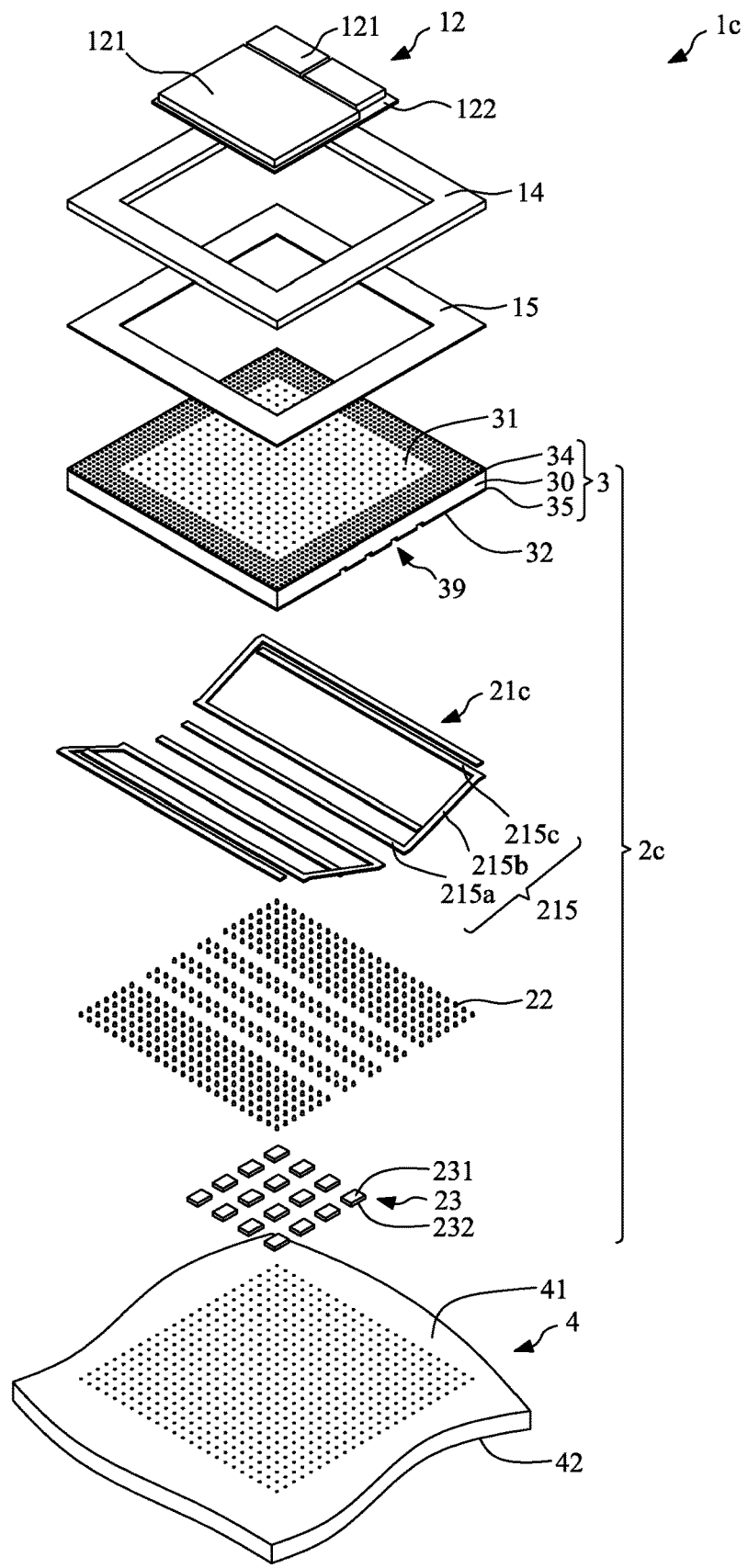
FIG. 11 illustrates an exploded perspective view of a semiconductor package structure according to some embodiments of the present disclosure.
Figure 12:
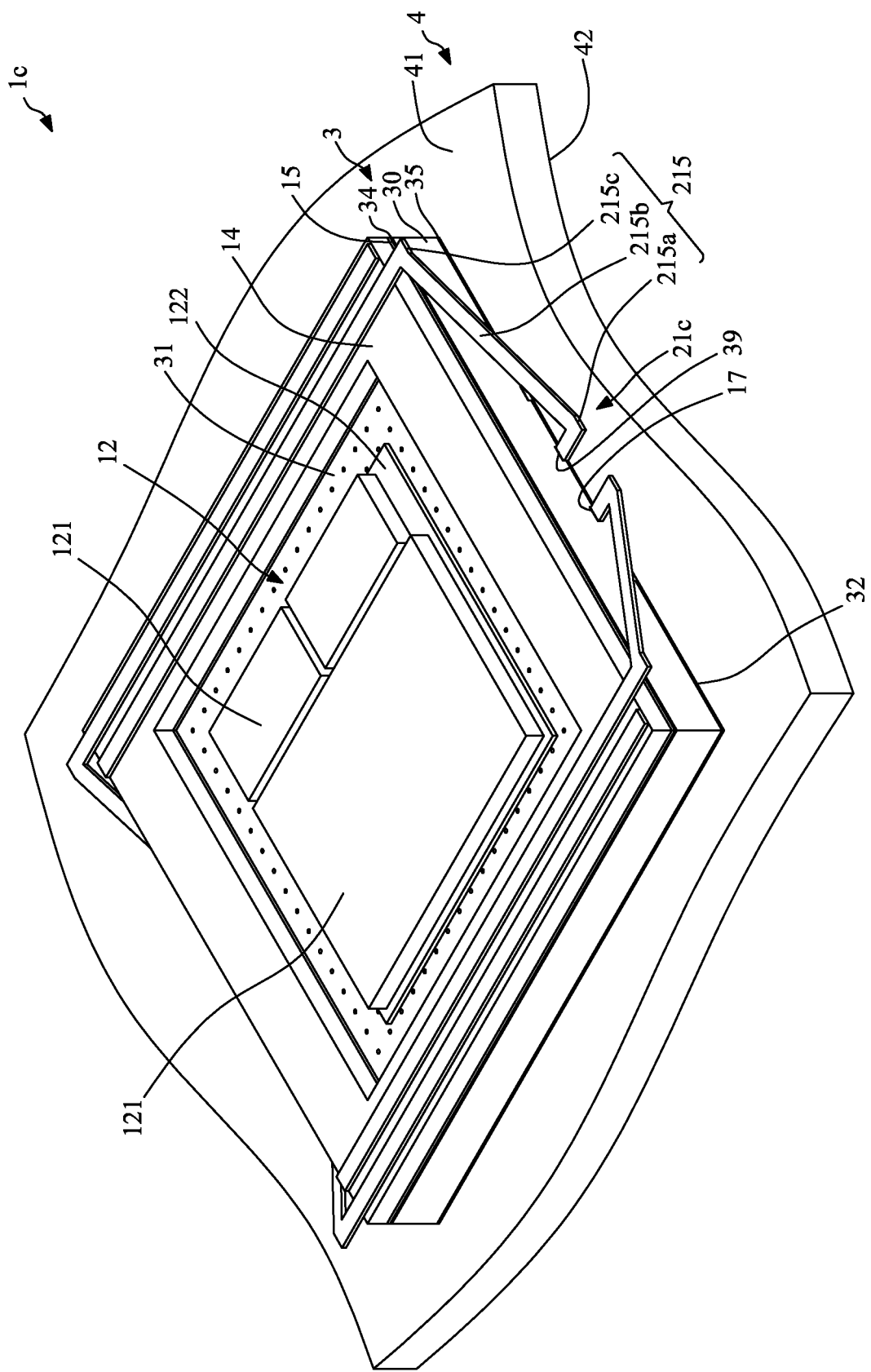
FIG. 12 illustrates an assembled perspective view of the semiconductor package structure of FIG. 11.

FIG. 11 illustrates an exploded perspective view of a semiconductor package structure 1c according to some embodiments of the present disclosure. FIG. 12 illustrates an assembled perspective view of the semiconductor package structure 1c of FIG. 11. The semiconductor package structure 1c is similar to the semiconductor package structure 1 shown in FIG. 1 through FIG. 6, except for a structure of the heat transmitting structure 21c of the substrate structure 2c. As shown in FIG. 9, the heat transmitting structure 21c includes a plurality of strip structures, e.g., U-shaped heat pipes 215. Each of the heat pipes 215 includes a first end 215a, a connecting portion 215b and a second end 215c. The connecting portion 215b connects the first end 215a and the second end 215c. The first end 215a of the heat pipe 215 is disposed adjacent to the second surface 32 of the package substrate 3. In some embodiments, the first end 215a of the heat pipe 215 is disposed in the groove 39 recessed from the second surface 32 of the package substrate 3, and the electronic device 23 covers the first end 215a of the heat pipe 215. Thus, the first end 215a of the heat pipe 215 is thermally connected to the electronic device 23. Further, the connecting portion 215b of the heat pipe 215 is disposed outside the package substrate 3. That is, the strip structures of the heat transmitting structure 21c extend to outside the package substrate 3.

In addition, the second end 215c of the heat pipe 215 is disposed adjacent to the first surface 31 of the package substrate 3. In some embodiments, the second end 215c of the heat pipe 215 is disposed on the top surface of the heat dissipating device 14. Thus, the second end 215c of the heat pipe 215 is thermally connected to the heat dissipating device 14. In the embodiment illustrated in FIG. 11 and FIG. 12, the heat generated by the electronic device 23 during operation may be transmitted to the heat dissipating device 14 through two paths. The first path includes the first end 215a of the heat pipe 215, the outer vias 362 and the thermal vias 363. The second path includes the first end 215a, the connecting portion 215b and the second end 215c of the heat pipe 215.

Figure 14:
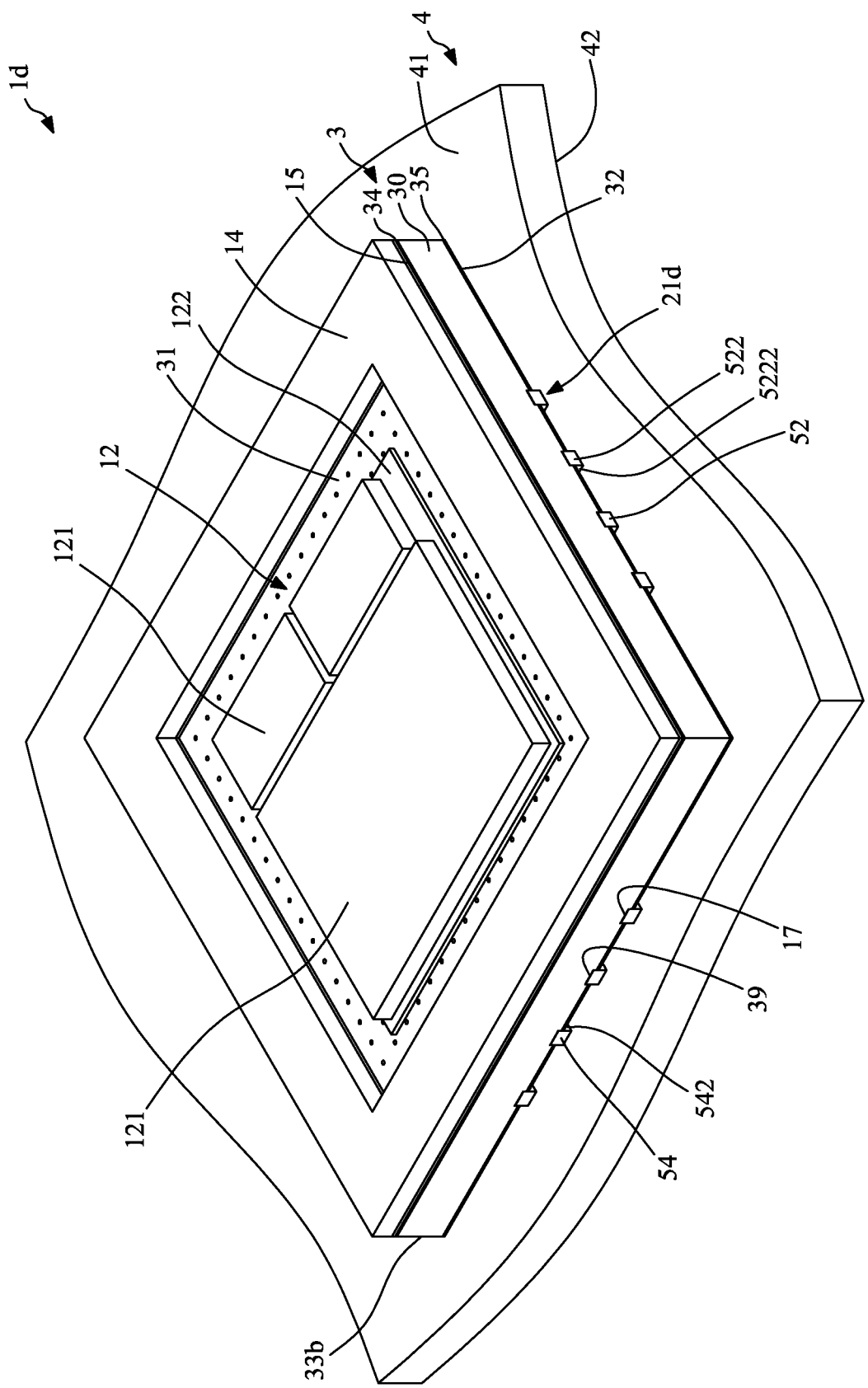
FIG. 14 illustrates an assembled perspective view of the semiconductor package structure of FIG. 13.
Figure 15:
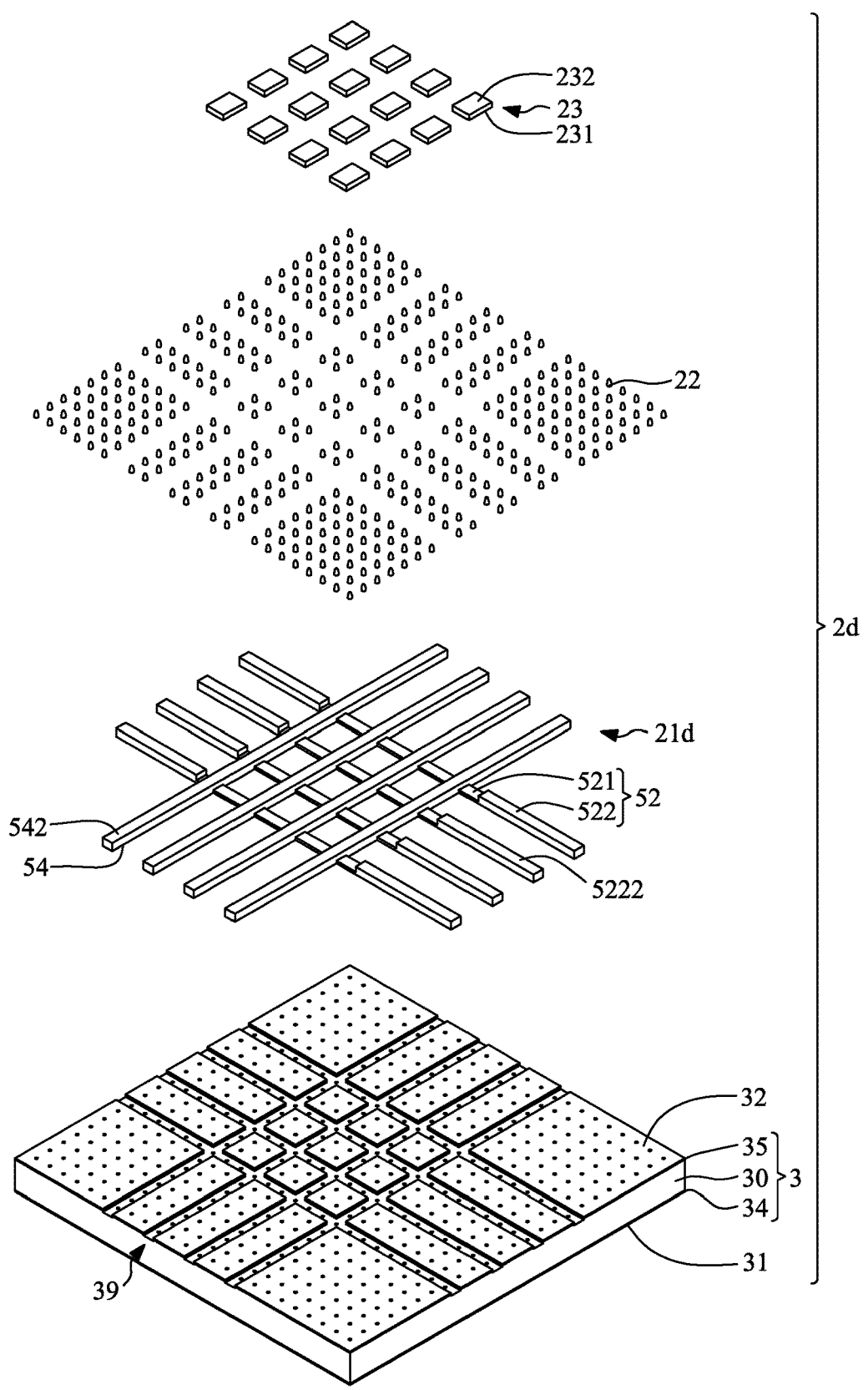
FIG. 15 illustrates a bottom exploded perspective view of the package substrate, the heat transmitting structure, the solder bumps and the electronic device of the semiconductor package structure of FIG. 13.
Figure 16:
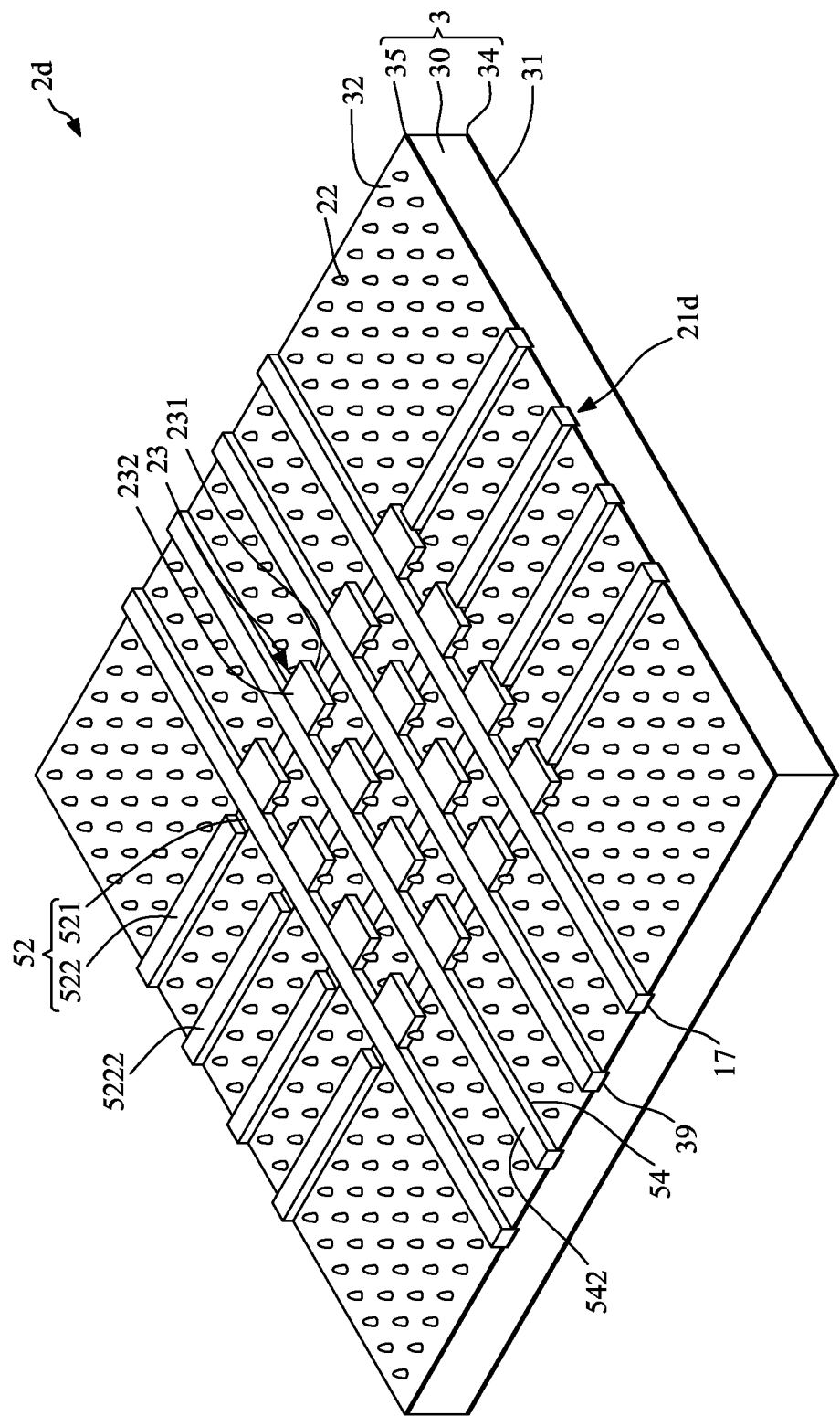
FIG. 16 illustrates an assembly view of FIG. 15.

FIG. 13 illustrates an exploded perspective view of a semiconductor package structure 1d according to some embodiments of the present disclosure. FIG. 14 illustrates an assembled perspective view of the semiconductor package structure 1d of FIG. 13. FIG. 15 illustrates a bottom exploded perspective view of the package substrate 3, the heat transmitting structure 21d, the solder bumps 22 and the electronic device 23 of the semiconductor package structure 1d of FIG. 13. FIG. 16 illustrates an assembly view of FIG. 15. The semiconductor package structure 1d is similar to the semiconductor package structure 1 shown in FIG. 1 through FIG. 6, except for a structure of the heat transmitting structure 21d of the substrate structure 2d. As shown in FIG. 15 and FIG. 16, the heat transmitting structure 21d includes a plurality of metal strips 52 and a plurality of heat pipes 54. The metal strips 52 are substantially parallel with one another. Each of the metal strips 52 includes a first portion 521 corresponding to the electronic device 23 and a second portion 522. A thickness of the second portion 522 is greater than a thickness of the first portion 521. For example, the thickness of the second portion 522 is substantially equal to a sum of the thickness of the first portion 521 and a thickness of the electronic device 23. In some embodiments, the thickness of the second portion 522 may be 0.77 mm, and the thickness of the first portion 521 may be 0.2 mm. The second portion 522 of the metal strip 52 has a second surface 5222. The first portion 521 and a portion of the second portion 522 may be disposed in the groove 39. Another portion of the second portion 522 may protrude from the second surface 32 of the package substrate 3, and the second surface 5222 of the second portion 522 may contact the first surface 41 of the bottom device 4 as shown in FIG. 14. Thus, the second portion 522 of the metal strip 52 may be thermally connected to the vias in the bottom device 4. Further, the electronic device 23 is disposed adjacent to the second surface 32 of the package substrate 3 and across the first portion 521 of the metal strip 52. The electronic device 23 covers the first portion 521 of the metal strip 52. Thus, the heat transmitting structure 21d is thermally connected to the electronic device 23 and the heat dissipating device 14.

In addition, the heat pipes 54 are substantially parallel with one another and perpendicular to and cross with the first portions 521 of the metal strips 52 to form a plurality intersection portions. Thus, the metal strips 52 are thermally connected to the heat pipes 54. Portions of the first portion 521 of the metal strips 52 at the intersection portions may be embedded in the heat pipes 54. Each of the heat pipes 54 has a second surface 542. In some embodiments, a thickness of the heat pipe 54 may be 0.77 mm. A portion of the heat pipe 54 may be disposed in the groove 39. Another portion of the heat pipe 54 may protrude from the second surface 32 of the package substrate 3, and the second surface 542 of the heat pipe 54 may contact the first surface 41 of the bottom device 4 as shown in FIG. 14. Thus, the heat pipes 54 may be thermally connected to the vias in the bottom device 4. As a result, the heat generated by the electronic device 23 during operation may be transmitted to the bottom side of the bottom device 4 through the metal strips 52, the heat pipes 54 and the vias in the bottom device 4.

Figure 17:
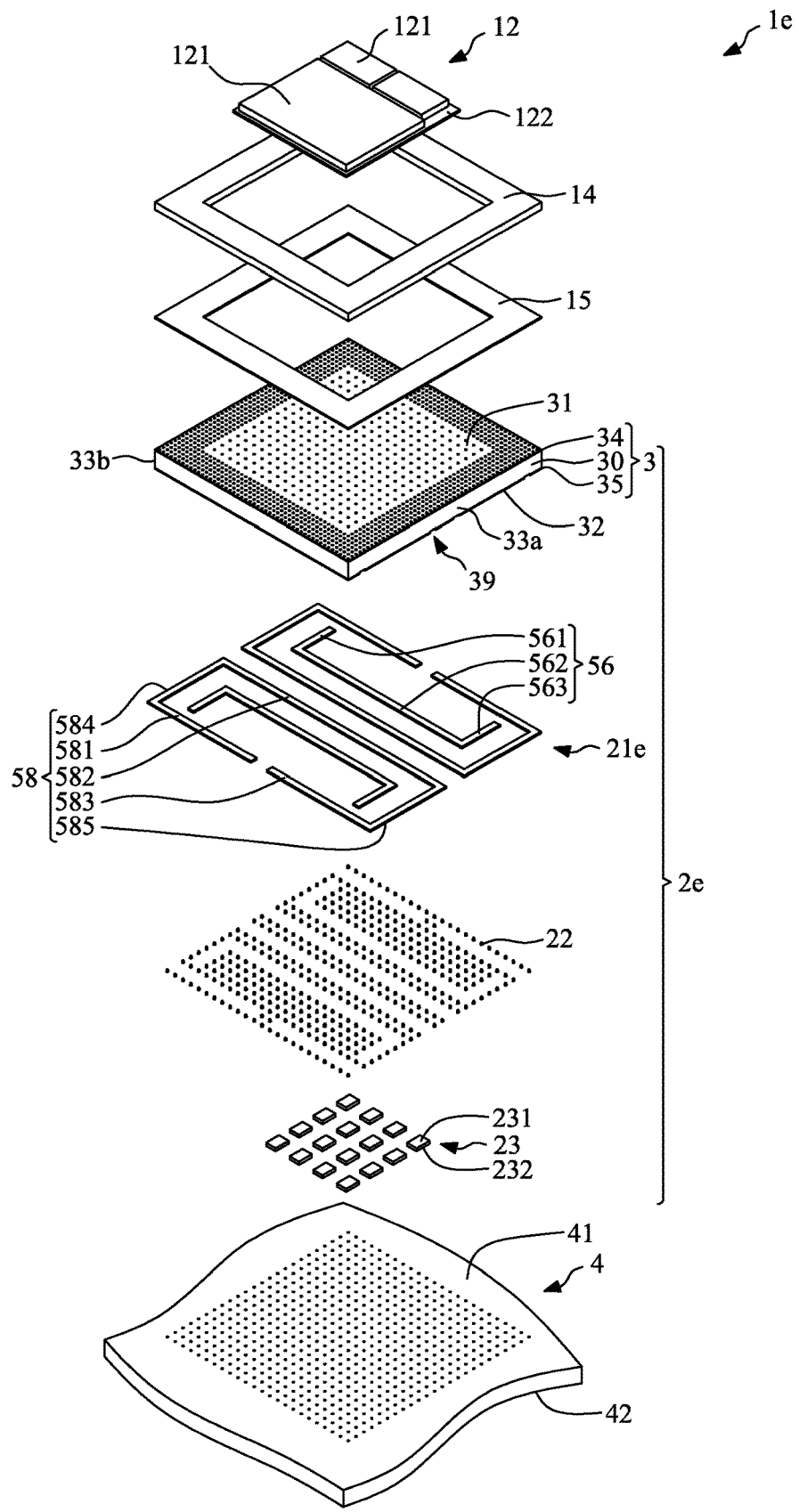
FIG. 17 illustrates an exploded perspective view of a semiconductor package structure according to some embodiments of the present disclosure.
Figure 18:
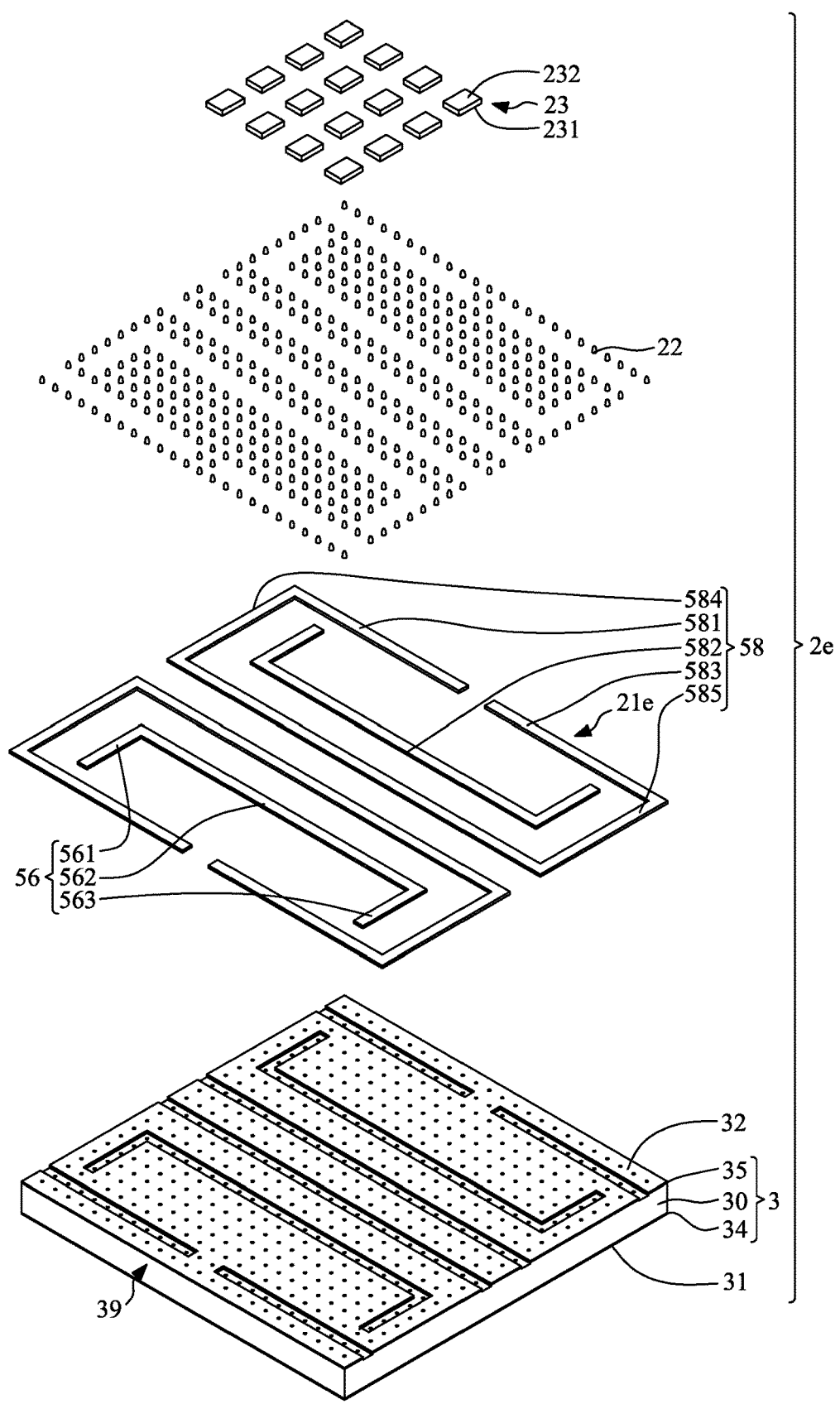
FIG. 18 illustrates a bottom exploded perspective view of the package substrate, the heat transmitting structure, the solder bumps and the electronic device of the semiconductor package structure of FIG. 17.
Figure 19:
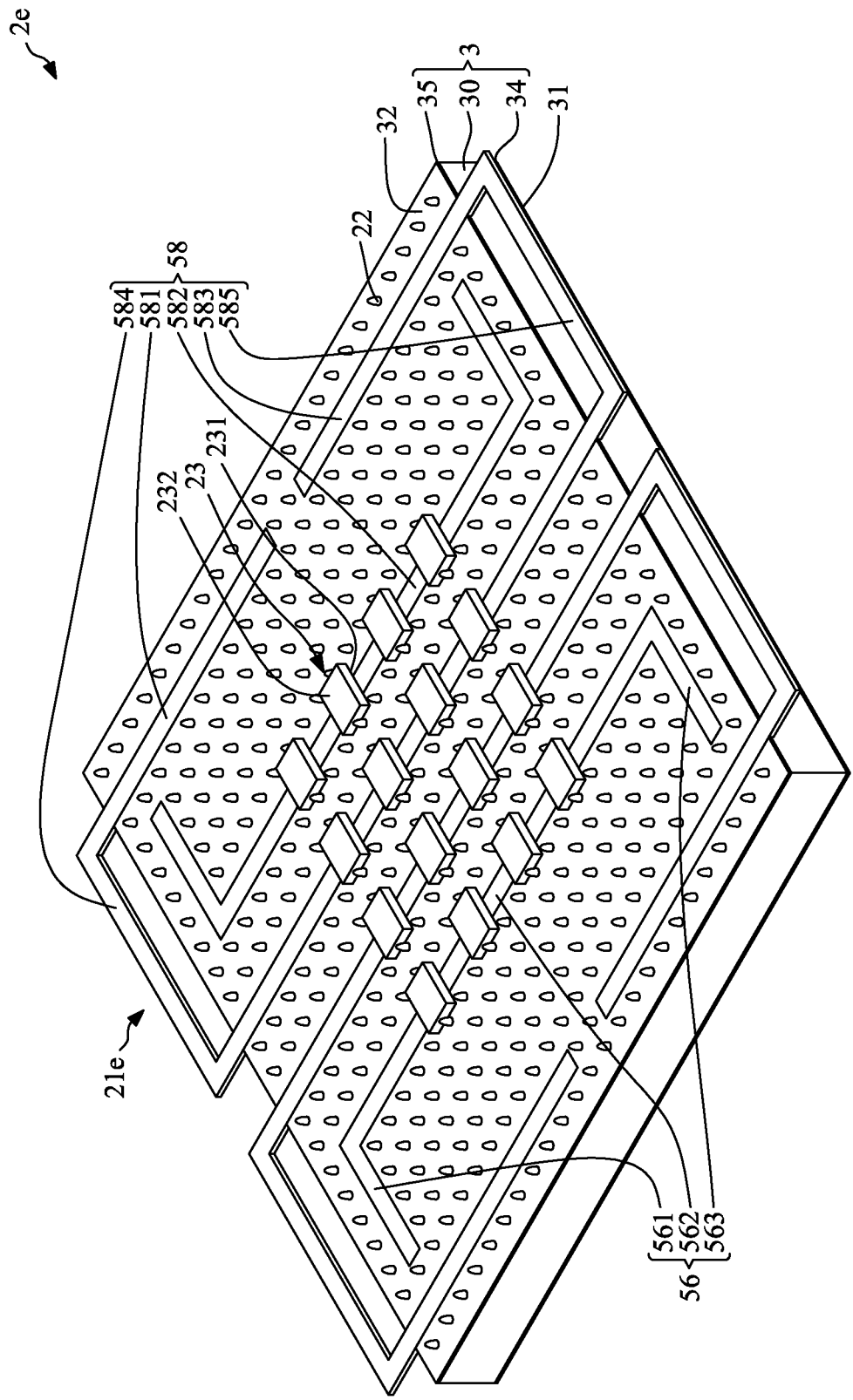
FIG. 19 illustrates an assembly view of FIG. 18.

FIG. 17 illustrates an exploded perspective view of a semiconductor package structure 1e according to some embodiments of the present disclosure. FIG. 18 illustrates a bottom exploded perspective view of the package substrate 3, the heat transmitting structure 21e, the solder bumps 22 and the electronic device 23 of the semiconductor package structure 1e of FIG. 17. FIG. 19 illustrates an assembly view of FIG. 18. The semiconductor package structure 1e is similar to the semiconductor package structure 1 shown in FIG. 1 through FIG. 6, except for a structure of the heat transmitting structure 21e. As shown in FIG. 18 and FIG. 19, the heat transmitting structure 21e includes two first heat pipes 56 and two second heat pipes 58. Each of the first heat pipes 56 includes a first end 561, a connecting portion 562 and a second end 563. The connecting portion 562 connects the first end 561 and the second end 563. The first heat pipes 56 are disposed in the groove 39 recessed from the second surface 32 of the package substrate 3, and the electronic device 23 covers the connecting portion 562. Thus, the connecting portion 562 is thermally connected to the electronic device 23. The first heat pipe 56 does not protrude from the second surface 32 of the package substrate 3. The first end 561 and the second end 563 of the first heat pipe 56 extend within the outer area 392 of the package substrate 3.

Each of the second heat pipes 58 includes a first end 581, a connecting portion 582, a second end 583, a first extending portion 584 and a second extending portion 585. The connecting portion 582 connects the first end 581 through the first extending portion 584, and connects the second end 583 through the second extending portion 585. The second heat pipes 58 are disposed in the groove 39 recessed from the second surface 32 of the package substrate 3, and the electronic device 23 covers the connecting portion 582. Thus, the connecting portion 582 is thermally connected to the electronic device 23. The second heat pipe 58 does not protrude from the second surface 32 of the package substrate 3. The first end 581 and the second end 583 of the second heat pipe 58 extend within the outer area 392 of the package substrate 3. The first extending portion 584 and the second extending portion 585 are disposed outside the package substrate 3. That is, the heat transmitting structure 21e extends to outside the package substrate 3.

Figure 20:
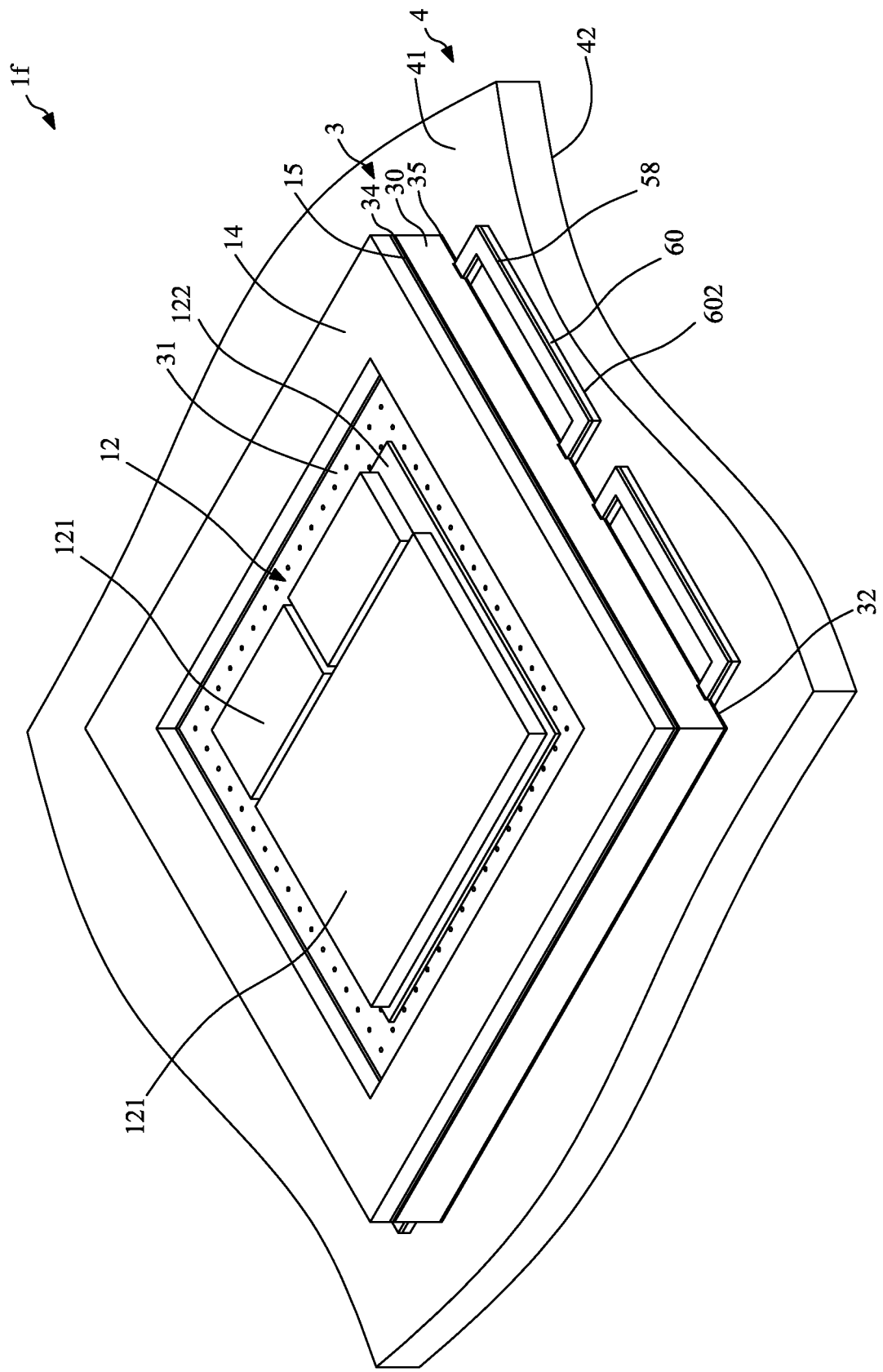
FIG. 20 illustrates an assembled perspective view of a semiconductor package structure according to some embodiments of the present disclosure.
Figure 21:
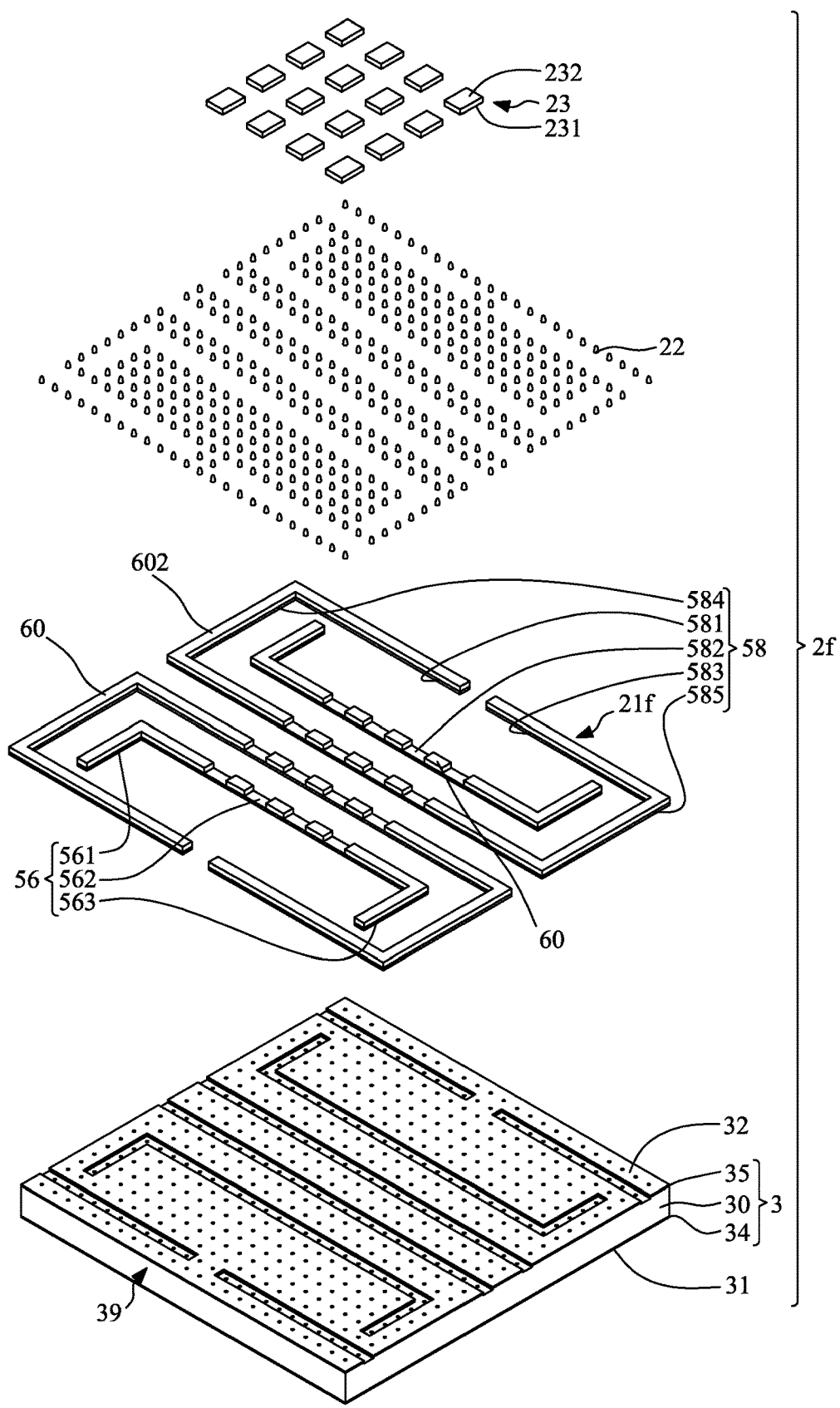
FIG. 21 illustrates a bottom exploded perspective view of the package substrate, the heat transmitting structure, the solder bumps and the electronic device of the semiconductor package structure of FIG. 20.
Figure 22:
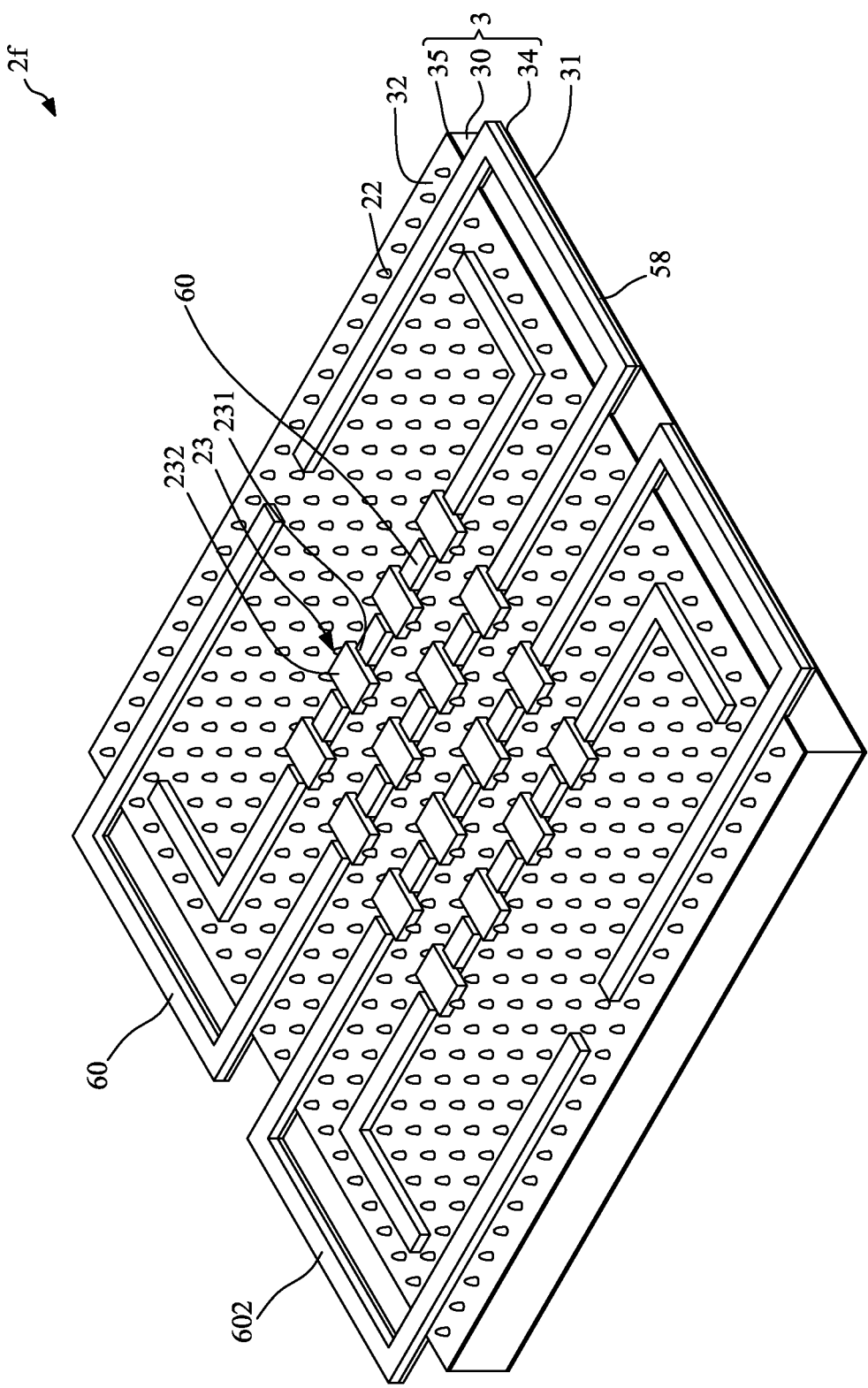
FIG. 22 illustrates an assembly view of FIG. 21.

FIG. 20 illustrates an assembled perspective view of a semiconductor package structure if according to some embodiments of the present disclosure. FIG. 21 illustrates a bottom exploded perspective view of the package substrate 3, the heat transmitting structure 21f, the solder bumps 22 and the electronic device 23 of the semiconductor package structure if of FIG. 20. FIG. 22 illustrates an assembly view of FIG. 21. The semiconductor package structure if is similar to the semiconductor package structure 1e shown in FIG. 17 through FIG. 19, except for a structure of the heat transmitting structure 21f of the substrate structure 2f. As shown in FIG. 21 and FIG. 22, the heat transmitting structure 21f includes two first heat pipes 56, two second heat pipes 58 and a plurality of metal strips 60. The first heat pipes 56 and the second heat pipes 58 of the heat transmitting structure 21f are same as the first heat pipes 56 and the second heat pipes 58 of the heat transmitting structure 21e of FIG. 18 and FIG. 19. The metal strips 60 are disposed on the first heat pipes 56 and the second heat pipes 58, and the lengths and widths of the metal strips 60 are substantially equal to the corresponding first heat pipes 56 and second heat pipes 58. Each of the metal strips 60 may have a second surface 602. A thickness of each of the metal strips 60 may be equal to or greater than a thickness of the electronic device 23. For example, a thickness of the first heat pipe 56 and the second heat pipe 58 may be 0.2 mm, and a thickness of the metal strip 60 may be 0.57 mm. Some of the metal strips 60 are disposed between the electronic devices 23. The metal strips 60 may protrude from the second surface 32 of the package substrate 3, and the second surface 602 of the metal strip 60 may contact the first surface 41 of the bottom device 4 as shown in FIG. 19. Thus, the metal strips 60 may be thermally connected to the vias in the bottom device 4.

Figure 23:
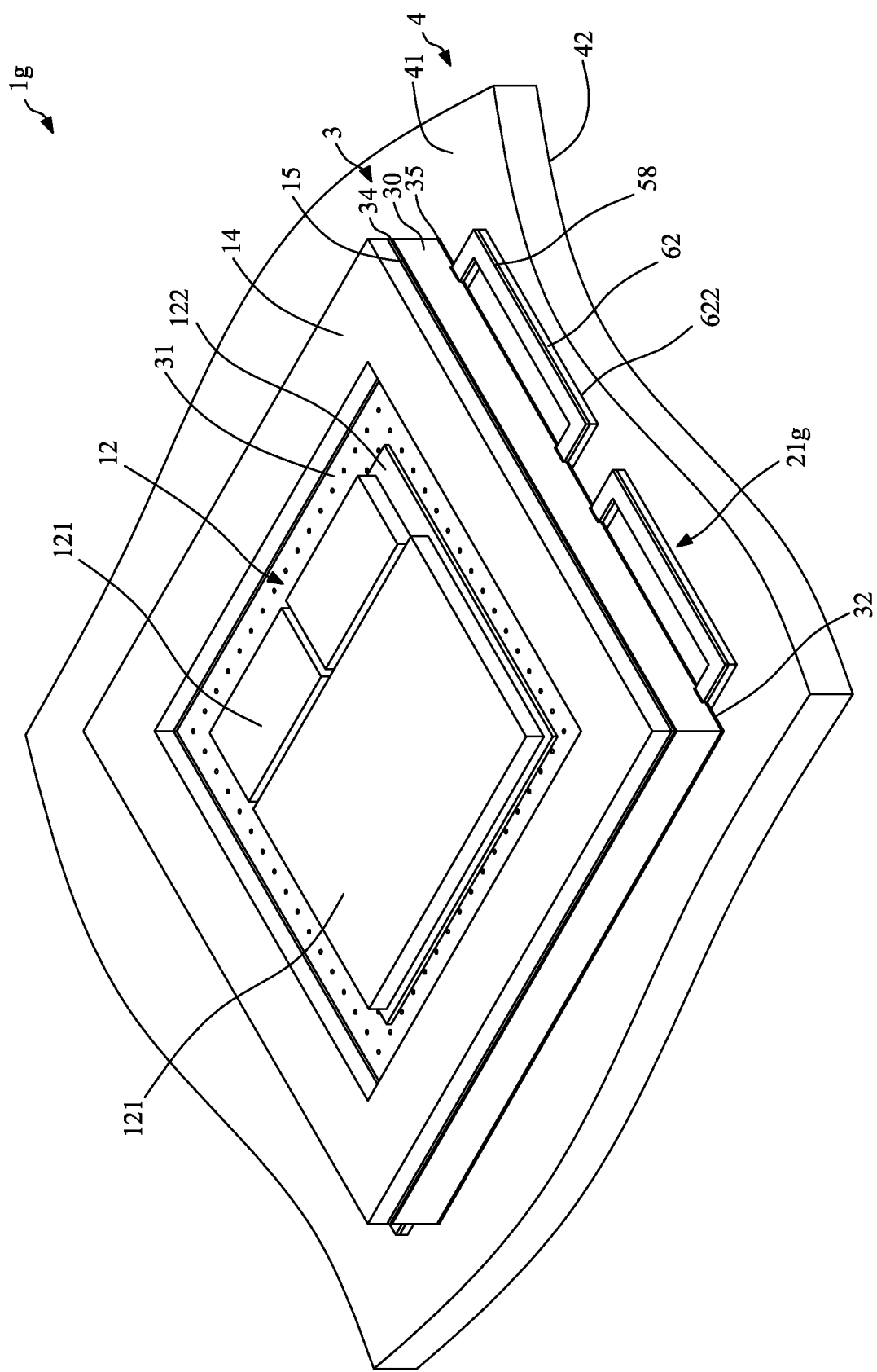
FIG. 23 illustrates an assembled perspective view of a semiconductor package structure according to some embodiments of the present disclosure.
Figure 24:
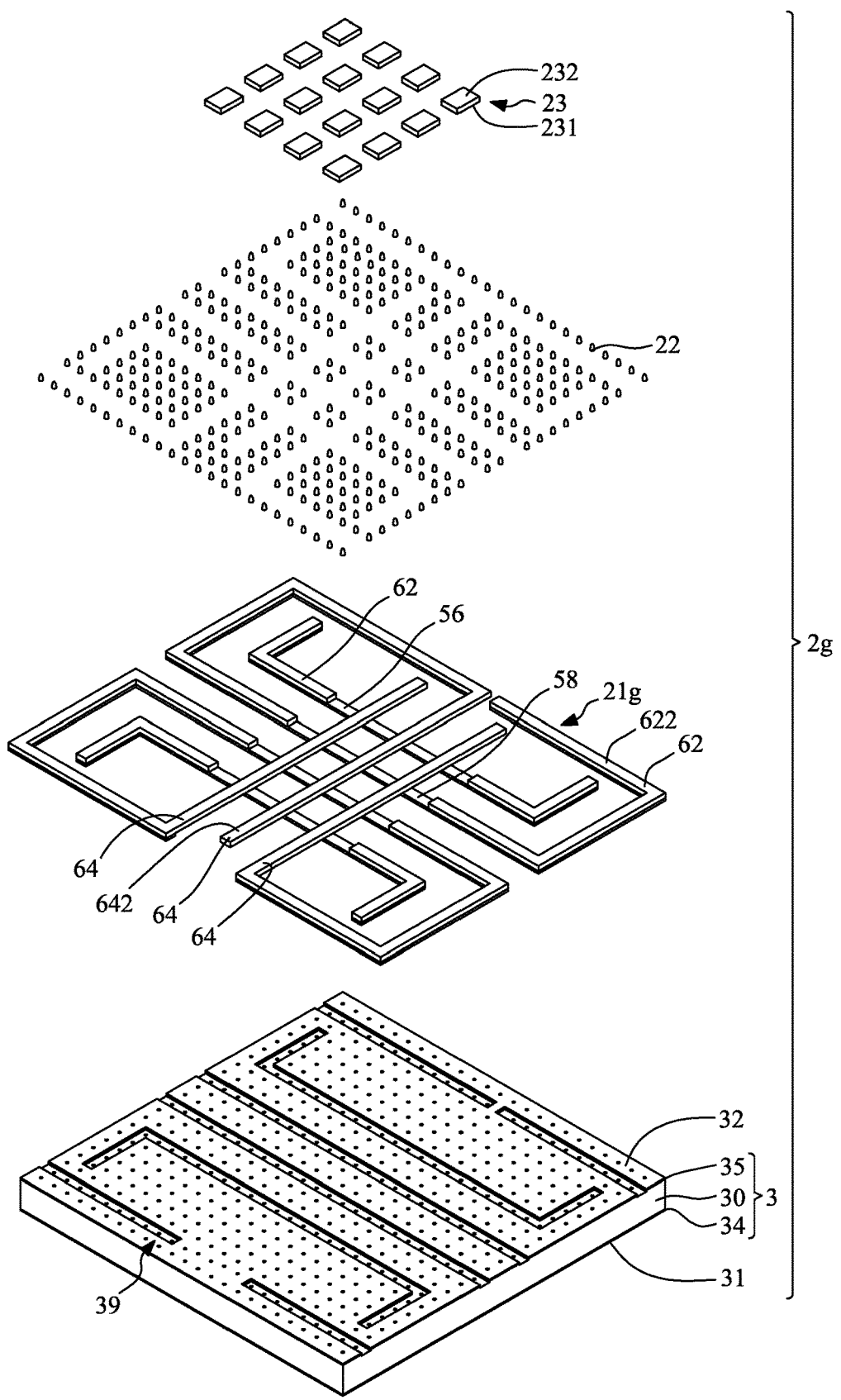
FIG. 24 illustrates a bottom exploded perspective view of the package substrate, the heat transmitting structure, the solder bumps and the electronic device of the semiconductor package structure of FIG. 23.
Figure 25:
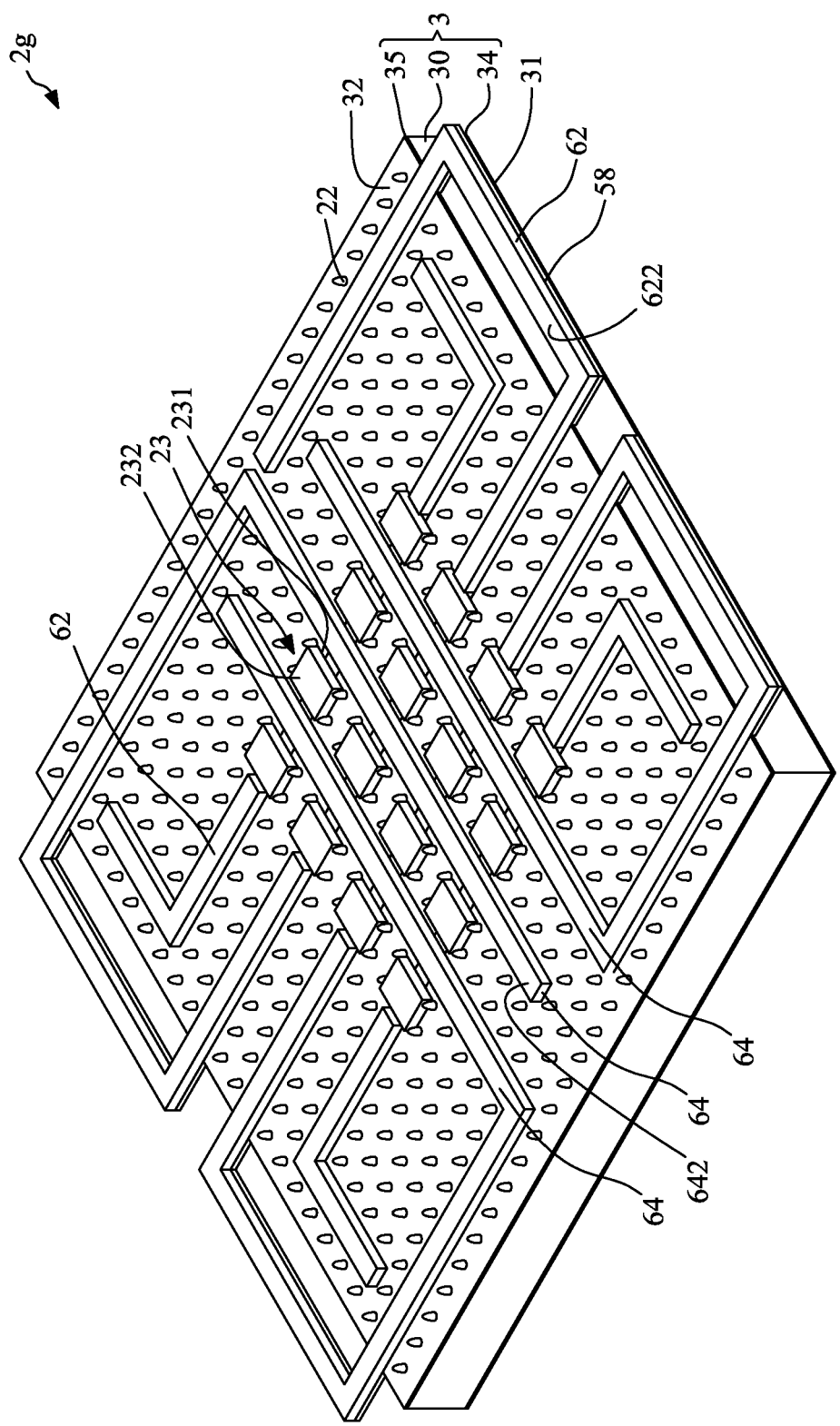
FIG. 25 illustrates an assembly view of FIG. 24.

FIG. 23 illustrates an assembled perspective view of a semiconductor package structure 1g according to some embodiments of the present disclosure. FIG. 24 illustrates a bottom exploded perspective view of the package substrate 3, the heat transmitting structure 21g, the solder bumps 22 and the electronic device 23 of the semiconductor package structure 1g of FIG. 23. FIG. 25 illustrates an assembly view of FIG. 24. The semiconductor package structure 1g is similar to the semiconductor package structure 1e shown in FIG. 17 through FIG. 19, except for a structure of the heat transmitting structure 21g of the substrate structure 2g. As shown in FIG. 24 and FIG. 25, the heat transmitting structure 21g includes two first heat pipes 56, two second heat pipes 58, a plurality of third heat pipes 62 and three fourth heat pipes 64. The first heat pipes 56 and the second heat pipes 58 of the heat transmitting structure 21g are same as the first heat pipes 56 and the second heat pipes 58 of the heat transmitting structure 21e of FIG. 18 and FIG. 19. The third heat pipes 62 are disposed on the first heat pipes 56 and the second heat pipes 58, and the lengths and widths of the third heat pipes 62 are substantially equal to the corresponding first heat pipes 56 and second heat pipes 58. The fourth heat pipes 64 are substantially parallel with one another and perpendicular to and cross with the connecting portions 562 of the first heat pipes 56 and the connecting portions of the second heat pipes 58 to form a plurality intersection portions. Each of the third heat pipes 62 may have a second surface 622, and each of the fourth heat pipes 64 may have a second surface 642. A thickness of each of the third heat pipes 62 and a thickness of each of the fourth heat pipes 64 may both be equal to or greater than a thickness of the electronic device 23. For example, a thickness of the first heat pipe 56 and the second heat pipe 58 may be 0.2 mm, and a thickness of the third heat pipe 62 and the fourth heat pipe 64 may be 0.57 mm. The third heat pipes 62 and the fourth heat pipes 64 may protrude from the second surface 32 of the package substrate 3, and the second surface 622 of the third heat pipe 62 and the second surface 642 of the fourth heat pipe 64 may contact the first surface 41 of the bottom device 4 as shown in FIG. 22. Thus, the third heat pipes 62 and the fourth heat pipes 64 may be thermally connected to the vias in the bottom device 4.

Figure 26:
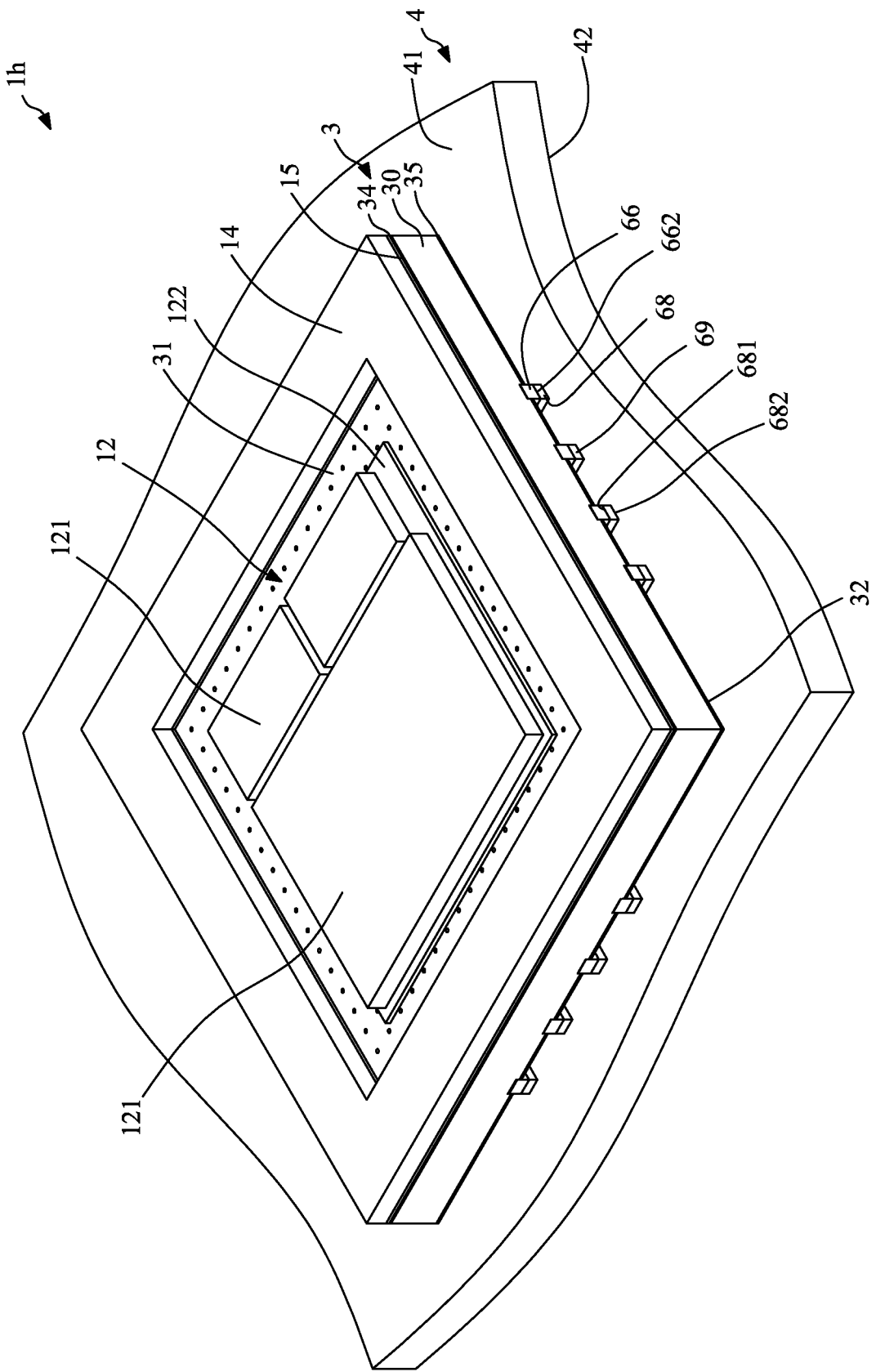
FIG. 26 illustrates an assembled perspective view of a semiconductor package structure according to some embodiments of the present disclosure.
Figure 27:
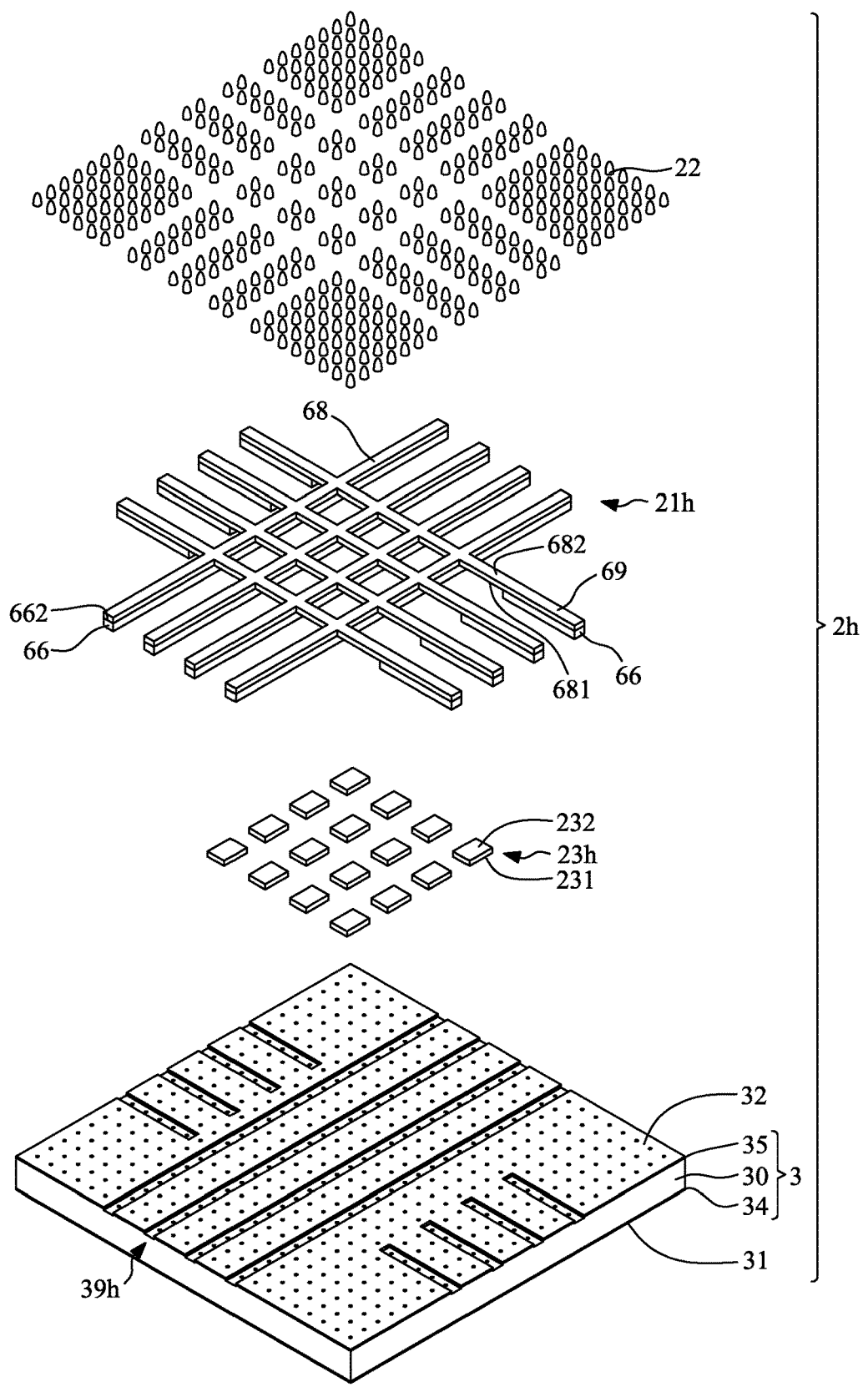
FIG. 27 illustrates a bottom exploded perspective view of the package substrate, the heat transmitting structure, the solder bumps and the electronic device of the semiconductor package structure of FIG. 26.
Figure 28:
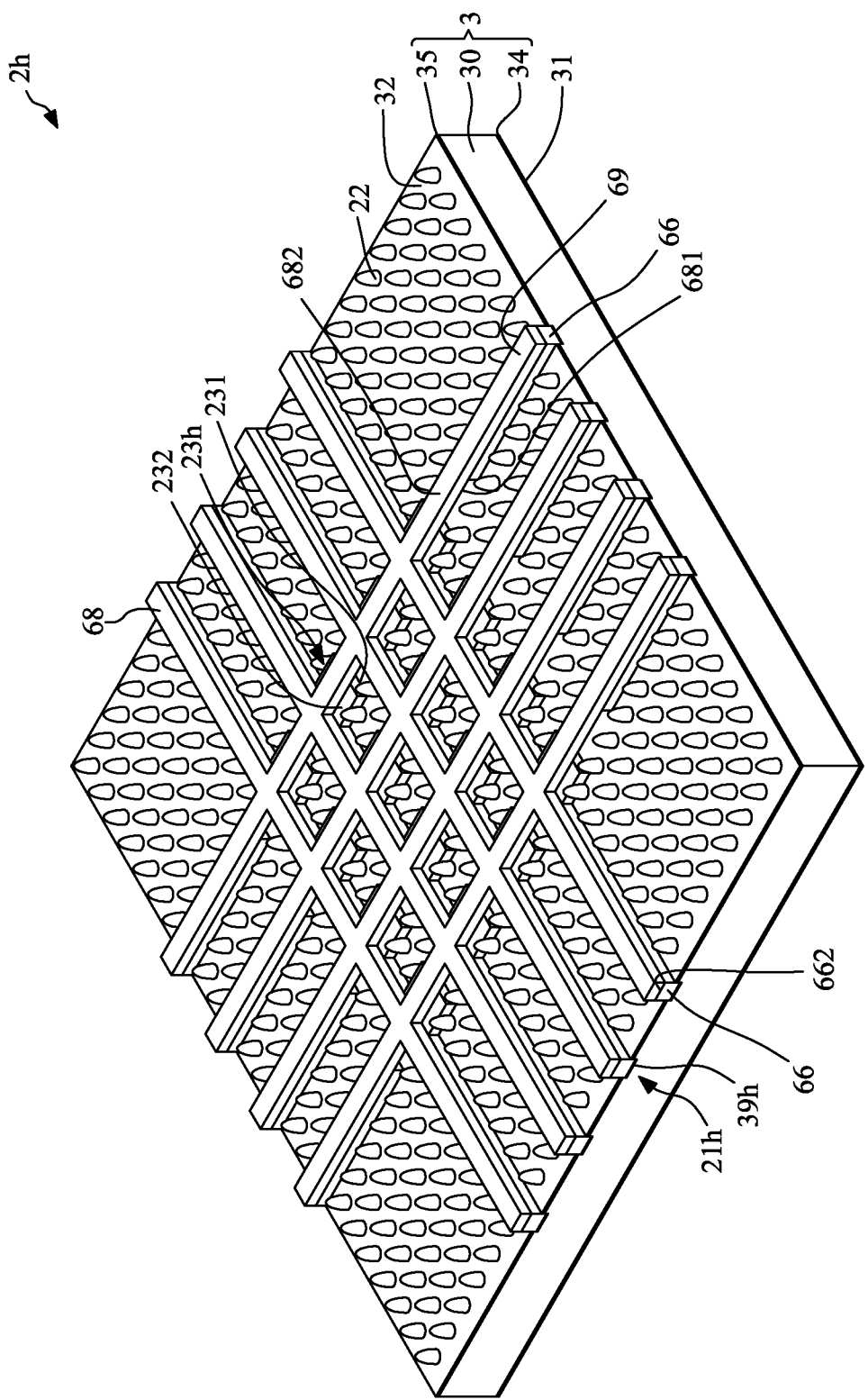
FIG. 28 illustrates an assembly view of FIG. 27.

FIG. 26 illustrates an assembled perspective view of a semiconductor package structure 1h according to some embodiments of the present disclosure. FIG. 27 illustrates a bottom exploded perspective view of the package substrate 3, the heat transmitting structure 21h, the solder bumps 22 and the electronic device 23h of the semiconductor package structure 1h of FIG. 26. FIG. 28 illustrates an assembly view of FIG. 27. The semiconductor package structure 1h is similar to the semiconductor package structure 1 shown in FIG. 1 through FIG. 6, except for structures of the groove 39h, the heat transmitting structure 21h and the electronic device 23h of the substrate structure 2h. As shown in FIG. 27 and FIG. 28, the electronic device 23h is a ball grid array (BGA) type semiconductor package. The groove 39h includes a plurality of segments that are not communicated with or cross with each other. The heat transmitting structure 21h includes a plurality of heat pipes 66 and a metal frame 68. The heat pipes 66 are disposed in the groove 39h, and have a second surface 662. The electronic device 23h is disposed adjacent to the second surface 32 of the package substrate 3 and does not across the heat pipes 66. A thickness of the heat pipe 66 may be 0.47 mm, and the second surface 662 of the heat pipe 66 may be substantially coplanar with the second surface 232 of the electronic device 23h. The metal frame 68 is disposed on the electronic devices 23h and the heat pipes 66. The metal frame 68 includes a plurality of metal strips 69 cross with one another to form a grid shape, and may be formed integrally as a monolithic structure. A thickness of each of the metal strips 69 may be 0.3 mm. The metal frame 68 has a first surface 681 and a second surface 682 opposite to the first surface 681. The first surface 681 of the metal frame 68 may contact or thermally connect the second surface 662 of the heat pipe 66 and the second surface 232 of the electronic device 23h. The second surface 682 of the metal frame 68 may contact or thermally connect the vias in the bottom device 4.

A method for manufacturing a semiconductor package structure according to some embodiments of the present disclosure is described as follows. In some embodiments, the method is for manufacturing the semiconductor package structure 1 shown in FIG. 1 through FIG. 6. Firstly, a package substrate is provided. For example, the package substrate may be the package substrate 3 (or the substrate body 30) without the groove 39. The package substrate 3 has a first surface 31 and a second surface 32 opposite to the first surface 31, and includes a dielectric structure (for example, including the passivation layers 37, the first protection layer 34 and the second protection layer 35) and at least one circuit layer (e.g., the circuit layer 38) embedded in the dielectric structure. Then, a plurality of thermal vias (e.g., the thermal vias 363) are formed to substantially extend through the package substrate 3 (or the substrate body 30). Then, at least one groove (e.g. the groove 39) is formed on the second surface 32 of the package substrate 3. In some embodiment, the groove 39 extends from a first lateral peripheral surface (e.g., the right lateral peripheral surface 33a) of the package substrate 3 to a second lateral peripheral surface (e.g., the left lateral peripheral surface 33b) of the package substrate 3 opposite to the first lateral peripheral surface 33. In some embodiment, the groove 39 is formed by machining such as milling.

Then, a heat transmitting structure (e.g., the heat transmitting structure 21) is attached to the package substrate 3 in the groove 39, 34. In some embodiment, the heat transmitting structure 21 is attached to the package substrate 3 through a soldering material (e.g., the soldering material 17). Then, at least one electronic device 23 is attached to the second surface 32 of the package substrate 3. Thus, the electronic device is electrically connected to the package substrate 3 and thermally connected to the heat transmitting structure 21. In some embodiment, the electronic device 23 is disposed across a portion of the heat transmitting structure 21.

Then, a plurality of solder bumps (e.g., the solder bumps 22) are disposed to the second surface 32 of the package substrate 3 so as to obtain a substrate structure (e.g., the substrate structure 2). All of the solder bumps 22 do not contact the heat transmitting structure 21. Then, a heat dissipating device 14 is attached to or disposed on the first surface 31 of the package substrate 3. The heat dissipating device 14 is thermally connected to the thermal vias 363.

Then, an upper semiconductor device (e.g., the upper semiconductor device 12) is disposed on and electrically connected to the first surface 31 of the package substrate 3. The upper semiconductor device 12 may include an interposer 122 and at least one semiconductor die 121 (e.g., three semiconductor dice 121) disposed on and electrically connected to the interposer 122. Thus, the semiconductor die 121 is electrically connected to the first surface 31 of the package substrate 3. The heat dissipating device 14 may be a ring structure surrounding the upper semiconductor device 12 (including the semiconductor die 121).

Then, the substrate structure 2 with the heat dissipating device 14 and the upper semiconductor device 12 is attached to a bottom device (e.g., the bottom device 4), so as to obtain the semiconductor package structure 1 shown in FIG. 1 through FIG. 6.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 µm, no greater than 2 µm, no greater than 1 µm, or no greater than 0.5 µm. A surface can be deemed to be substantially flat if a displacement between a highest point and a lowest point of the surface is no greater than 5 µm, no greater than 2 µm, no greater than 1 µm, or no greater than 0.5 µm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor package structure, comprising:
   a package substrate having a first surface and a second surface opposite to the first surface;
   at least one semiconductor die electrically connected to the first surface of the package substrate;
   a heat dissipating device thermally connected to the first surface of the package substrate;
   at least one electronic device electrically connected to the second surface of the package substrate, wherein the electronic device has a first surface and a second surface opposite to the first surface, and the first surface of the electronic device faces the second surface of the package substrate; and
   a heat transmitting structure disposed adjacent to the second surface of the package substrate, and thermally connected to the electronic device and the heat dissipating device,
   wherein the at least one electronic device is in contact with the heat transmitting structure.

2. The semiconductor package structure of claim 1, wherein the package substrate includes a plurality of thermal vias substantially extending through the package substrate and thermally connecting the heat transmitting structure and the heat dissipating device.

3. The semiconductor package structure of claim 1, further comprising a plurality of solder bumps disposed adjacent to the second surface of the package substrate and electrically isolated from the heat transmitting structure.

4. The semiconductor package structure of claim 1, wherein the heat transmitting structure includes a plurality of strip structures, and the strip structure includes a metal strip, a heat pipe or a combination thereof.

5. The semiconductor package structure of claim 4, wherein the strip structures extend to a lateral peripheral surface of the package substrate and connect to one another.

6. The semiconductor package structure of claim 4, wherein the strip structures extend to outside the package substrate.

7. The semiconductor package structure of claim 1, wherein the heat transmitting structure extends to contact the heat dissipating device.

8. The semiconductor package structure of claim 1, wherein the package substrate defines at least one groove on the second surface thereof for accommodating the heat transmitting structure.

9. The semiconductor package structure of claim 1, wherein the heat transmitting structure is attached to the package substrate through a soldering material.

10. The semiconductor package structure of claim 1, wherein the heat transmitting structure has a first surface and a second surface opposite to the first surface, the first surface of the heat transmitting structure is far away from the second surface of the package substrate, and the second surface of the heat transmitting structure is substantially coplanar with the second surface of the package substrate.

11. The semiconductor package structure of claim 1, wherein the heat transmitting structure has a first surface and a second surface opposite to the first surface, the second surface of the heat transmitting structure is far away from the second surface of the package substrate, and the second surface of the electronic device is connected to the first surface of the heat transmitting structure.

12. The semiconductor package structure of claim 1, further comprising a bottom device bonded to the package substrate, wherein the second surface of the package substrate faces the bottom device, and the heat transmitting structure contacts the bottom device.

13. A semiconductor package structure, comprising:
a package substrate having a first surface and a second surface opposite to the first surface;
at least one semiconductor die electrically connected to the first surface of the package substrate;
a heat dissipating device thermally connected to the first surface of the package substrate;
at least one electronic device electrically connected to the second surface of the package substrate, wherein the electronic device has a first surface and a second surface opposite to the first surface, and the first surface of the electronic device faces the second surface of the package substrate; and
a heat transmitting structure disposed adjacent to the second surface of the package substrate, and thermally connected to the electronic device and the heat dissipating device,
wherein the package substrate has an inner area and an outer area surrounding the inner area, and includes a plurality of inner vias and plurality of outer vias, wherein the inner vias are disposed in the inner area, the outer vias are disposed in the outer area, and a pitch between the inner vias is greater than a pitch between the outer vias.

14. The semiconductor package structure of claim 13, wherein the package substrate further comprises a plurality of thermal vias disposed in the outer area, the thermal vias substantially extend through the package substrate and thermally connect the heat transmitting structure and the heat dissipating device, and a width of the thermal via is greater than a width of the outer via.

15. A semiconductor package structure, comprising:
a package substrate having a first surface and a second surface opposite to the first surface;
at least one semiconductor die electrically connected to the first surface of the package substrate;
a heat dissipating device thermally connected to the first surface of the package substrate;
at least one electronic device electrically connected to the second surface of the package substrate, wherein the electronic device has a first surface and a second surface opposite to the first surface, and the first surface of the electronic device faces the second surface of the package substrate; and
a heat transmitting structure disposed adjacent to the second surface of the package substrate, and thermally connected to the electronic device and the heat dissipating device,
wherein the heat dissipating device overlaps with a peripheral portion of the heat transmitting structure in a normal direction of the first surface and the second surface of the package substrate.

16. The semiconductor package structure of claim 15, wherein the heat transmitting structure includes at least two portions extended in two different directions, and wherein one of the two directions is not parallel to the other direction of the two directions.

17. The semiconductor package structure of claim 16, wherein one of the two directions is substantially orthogonal to the other direction of the two directions.

18. The semiconductor package structure of claim 15, wherein the heat transmitting structure overlaps with the at least one electronic device in the normal direction.

19. The semiconductor package structure of claim 15, wherein the at least one electronic device is thermally coupled to the heat dissipating device through a first path along the heat transmitting structure in horizontal directions and through a second path along at least one thermal via in vertical directions, wherein the at least one thermal via is included in the package substrate and substantially extends through the package substrate.

20. The semiconductor package structure of claim 15, wherein the package substrate defines at least one groove on the second surface thereof for accommodating the heat transmitting structure.

* * * * *